United States Patent
Kamizono

(10) Patent No.: US 8,627,037 B2
(45) Date of Patent: Jan. 7, 2014

(54) MEMORY SYSTEM HAVING NONVOLATILE SEMICONDUCTOR STORAGE DEVICES

(75) Inventor: Akinori Kamizono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 13/045,087

(22) Filed: Mar. 10, 2011

(65) Prior Publication Data

US 2011/0271040 A1 Nov. 3, 2011

(30) Foreign Application Priority Data

Apr. 30, 2010 (JP) .................................. 2010-105622

(51) Int. Cl.
*G06F 12/00* (2006.01)
*G06F 13/00* (2006.01)
*G06F 13/28* (2006.01)

(52) U.S. Cl.
USPC ........... 711/167; 711/103; 711/150; 711/151; 711/157; 711/158

(58) Field of Classification Search
USPC ................. 711/103, 150–151, 154, 157–158, 711/167–168
See application file for complete search history.

(56) References Cited

U.S. PATENT DOCUMENTS

| | | | | |
|---|---|---|---|---|
| 6,134,145 A | * | 10/2000 | Wong | 365/185.22 |
| 6,857,055 B2 | * | 2/2005 | Jeddeloh | 711/163 |
| 8,407,407 B1 | * | 3/2013 | Adler et al. | 711/103 |
| 2002/0181311 A1 | * | 12/2002 | Miyauchi | 365/227 |
| 2004/0088511 A1 | * | 5/2004 | Bacon et al. | 711/167 |
| 2007/0168625 A1 | * | 7/2007 | Cornwell et al. | 711/157 |
| 2008/0219078 A1 | * | 9/2008 | Kamiyama | 365/226 |
| 2009/0157993 A1 | * | 6/2009 | Garrett, Jr. | 711/167 |
| 2010/0011158 A1 | | 1/2010 | Shiraishi et al. | |
| 2010/0036998 A1 | * | 2/2010 | Ben-Rubi | 711/100 |
| 2010/0250727 A1 | * | 9/2010 | King et al. | 709/224 |
| 2010/0274953 A1 | * | 10/2010 | Lee et al. | 711/103 |
| 2011/0035634 A1 | * | 2/2011 | Blaum et al. | 714/704 |
| 2011/0173462 A1 | * | 7/2011 | Wakrat et al. | 713/300 |

FOREIGN PATENT DOCUMENTS

| | | |
|---|---|---|
| JP | 2010-20715 | 1/2010 |
| KR | 10-2004-0105728 | 12/2004 |

OTHER PUBLICATIONS

Office Action issued Aug. 17, 2012, in Korean Patent Application No. 10-2011-23468 with English translation.

* cited by examiner

*Primary Examiner* — Ryan Bertram
(74) *Attorney, Agent, or Firm* — Oblon, Spivak, McClelland, Maier & Neustadt, L.L.P.

(57) ABSTRACT

According to an embodiment, a memory system includes a memory unit, a memory controller, a timer and a timer control unit. The memory unit has nonvolatile first and second chips capable of holding data. The memory controller transfers data received from host equipment simultaneously to the first and second chips. The timer measures a lapse of preset shift time. The timer control unit starts writing of data into the second chip immediately after the lapse of the shift time.

15 Claims, 23 Drawing Sheets

| AVERAGE CURRENT CONSUMPTION | BUSY SHIFT TIME (DATA IN SHIFT TIME) |
|---|---|
| $I_0$ | $T_0(=0)$ |
| $I_1$ | $T_1$ |
| $I_2$ | $T_2$ |
| $I_3$ | $T_3$ |
| ... | ... |
| $I_n$ | $T_n$ |

| Pin No | SD | | SPI |
|---|---|---|---|
| | 1 bit | 4 bit | 1 bit |
| 1 | CARD DETECTION (CD) | CARD DETECTION (CD) /DATA (DAT3) | CARD SELECTION (CS) |
| 2 | COMMAND (CMD) /RESPONSE (RES) | COMMAND (CMD) /RESPONSE (RES) | HOST TRANSMITTING COMMAND&DATA (DI) |
| 3 | GROUND VOLTAGE (VSS1) | GROUND VOLTAGE (VSS1) | GROUND VOLTAGE (VSS1) |
| 4 | POWER SUPPLY VOLTAGE (VDD) | POWER SUPPLY VOLTAGE (VDD) | POWER SUPPLY VOLTAGE (VDD) |
| 5 | CLOCK SIGNAL (CLK) | CLOCK SIGNAL (CLK) | CLOCK SIGNAL (CLK) |
| 6 | GROUND VOLTAGE (VSS2) | GROUND VOLTAGE (VSS2) | GROUND VOLTAGE (VSS2) |
| 7 | DATA (DAT0) | DATA (DAT0) | CARD TRANSMITTING COMMAND&DATA (DO) |
| 8 | | DATA (DAT1) | RSV |
| 9 | | DATA (DAT2) | RSV |

FIG.2

MEMORY CELL BLOCK BLK

| AVERAGE CURRENT CONSUMPTION | BUSY SHIFT TIME (DATA IN SHIFT TIME) |
|---|---|
| $I_0$ | $T_0(=0)$ |
| $I_1$ | $T_1$ |
| $I_2$ | $T_2$ |
| $I_3$ | $T_3$ |
| ... | ... |
| $I_n$ | $T_n$ |

FIG.11

MEMORY SYSTEM HAVING NONVOLATILE SEMICONDUCTOR STORAGE DEVICES

CROSS REFERENCE TO RELATED APPLICATION

This application is based upon and claims the benefit of priority from the prior Japanese Patent Application No. 2010-105622, filed on Apr. 30, 2010, the entire contents of which are incorporated herein by reference.

FIELD

Embodiments described herein relate to a memory system having nonvolatile semiconductor storage devices.

BACKGROUND

There has recently been development of semiconductor storage devices, e.g. flash memory cards which are nonvolatile semiconductor storage media. Such semiconductor storage devices are in widespread use as external storage devices of information equipment such as digital cameras, which are host equipment. The increase in volume of data to be handled by the host equipment has increased the capacity and density of a flash memory.

For the flash memory card, there is considered an approach to increase the speed of writing data into the flash memory. However, there is a problem of increased current consumption of the flash memory card.

BRIEF DESCRIPTION OF THE DRAWINGS

FIG. 2 is a table showing signal allocation to pins of a connector according to the embodiment;

FIG. 11 is a table showing a relationship between average current consumption and busy shift time or data-in shift time according to the embodiment;

DETAILED DESCRIPTION

Figure 1:
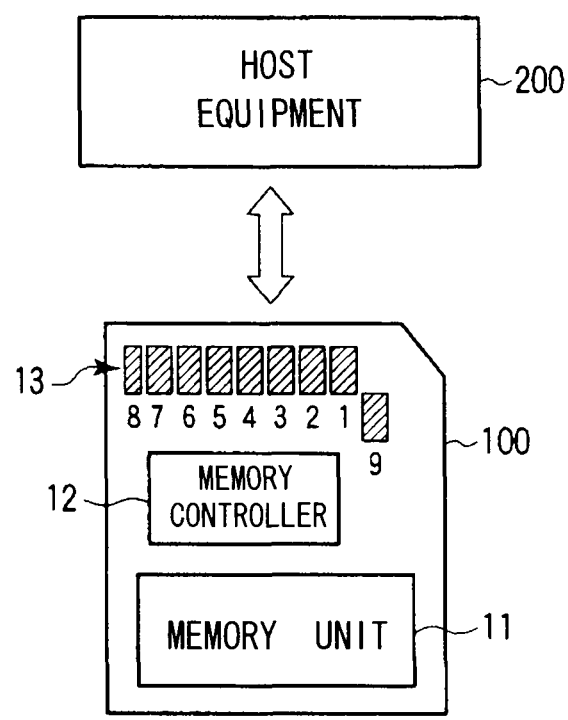
FIG. 1 is a block diagram schematically showing a memory system according to an embodiment.

According to an embodiment, a memory system includes a memory unit, a memory controller, a timer and a timer control unit. The memory unit has nonvolatile first and second chips capable of holding data. The memory controller transfers data received from host equipment simultaneously to the first and second chips. The timer measures a lapse of preset shift time. The timer control unit starts writing of data into the second chip immediately after the lapse of the shift time.

Further embodiments are described below with reference to the drawings. In the drawings, the same reference numerals denote the same or similar portions.

The configuration of a semiconductor device according to a first embodiment is described below with use of FIG. 1. FIG. 1 is a block diagram of a memory system according to the embodiment.

The overall configuration of the memory system is described with reference to the drawings. As shown in FIG. 1, a memory card 100 that is the memory system is connected to host equipment 200 through a connector 13. The host equipment 200 includes hardware and software to access the memory card 100 connected through the connector 13. The memory card 100 operates with power supplied when the memory card is connected to the host equipment 200, and performs processing in response to the access by the host equipment 200.

The configuration of the memory card is described. The memory card 100 is, for example, an SD memory card used as an external storage device of the host equipment 200 by being loaded into the host equipment 200. Examples of the host equipment 200 include information processing equipment including a personal computer, a digital camera and the like, which processes various data such as image data and music data.

Note that, in the embodiment, the memory card 100 and the host equipment 200, to which the memory card 100 is applied, may be configured as the memory system. Alternatively, the form of a card is not adopted, and instead a flash memory and a controller to control the flash memory may be incorporated into the host equipment 200 to configure the memory system. Note that electronics such as a PDA, an electronic book, a digital video and a mobile phone are also conceivable as the host equipment 200 other than those mentioned above.

The memory card 100 transmits and receives information to and from the host equipment 200 through the connector 13. The memory card 100 includes a memory unit (nonvolatile semiconductor storage unit) 11 that is an NAND flash memory chip (which may be simply called the NAND flash memory or flash memory), a memory controller (card controller) 12 which controls the memory unit 11, and the connector 13 having multiple signal pins (pins 1 to 9).

The connector 13 is electrically connected to the memory controller 12. Signal allocation to the pins 1 to 9 of the connector 13 is as shown in FIG. 2, for example. FIG. 2 is a table showing the pins 1 to 9 and signals allocated thereto. Note that, in FIG. 2, an SD mode (1-bit and 4-bit) and an SPI mode are data transfer operation modes specified by the SD memory card standard. Note that transfer modes of the memory card 100 include, depending on a transfer clock frequency and the like, an ultra high speed mode (also called "UHSM") supporting up to 104 MHz, and the like, in addition to a normal speed mode (also called "NSM") supporting up to 25 MHz and a high speed mode (also called "HSM") supporting up to 50 MHz.

The embodiment of the invention is more effective when applied to the case where the current consumption limit is specified in multiple steps during high-speed data transfer such as in the ultra high speed mode (UHSM), for example.

Data DAT0, DAT1, DAT2, DAT3 are allocated to the pins 7, 8, 9, 1, respectively. A card detection signal CD is also allocated to the pin 1. A command CMD and a response RES that is a response signal of the memory card 100 to the command CMD are allocated to the pin 2. A clock signal CLK is allocated to the pin 5. A power supply voltage VDD is allocated to the pin 4, a ground voltage VSS1 is allocated to the pin 3, and a ground voltage VSS2 is allocated to the pin 6.

The memory card 100 is formed so that the memory card can be inserted into and removed from a slot provided in the host equipment 200. A host controller (not shown) provided in the host equipment 200 communicates various signals and data with the memory controller 12 in the memory card 100 through the pins 1 to 9. For example, when data are written into the memory card 100, the host controller transfers a write command as a serial signal to the memory controller 12 through the pin 2. In this event, the memory controller 12 retrieves the write command given to the pin 2 in response to the clock signal supplied to the pin 5.

As the operation modes (hereinafter also referred to as the "transfer modes") during data transfer of the memory card 100 that is the SD memory card, the SD mode and the SPI mode are specified as described above. Furthermore, as the transfer modes of the SD mode, two modes are specified, including a 1-bit mode using only the data DAT0 and a 4-bit mode using the data DAT0 to DAT3. Note that the transfer modes of the memory card 100 include modes of various transfer speeds depending on the transfer clock frequency and the like.

In the SD mode (SD 4-bit mode) for data transfer with 4-bit bus width, four pins 1, 7, 8, 9 for data are all used for the data transfer. On the other hand, in the SD mode (SD 1-bit mode) for data transfer with 1-bit bus width, only the pin 7 is used for the data transfer, and the pins 8, 9 for data are not used. Moreover, the pin 1 is specified to be used for asynchronous interrupt, for example, from the memory card 100 to the host equipment 200, and the like.

The SPI mode is the 1-bit bus width transfer mode. In the SPI mode, the pin 7 is used for a data signal line (DATA OUT) from the memory card 100 to the host equipment 200, the pin 2 is used for a data signal line (DATA IN) from the host equipment 200 to the memory card 100, and the pins 8, 9 are not used. Moreover, in the SPI mode, the pin 1 is specified to be used for transmission of a chip select signal CS from the host equipment 200 to the memory card 100.

Note that whether to use the SD mode or the SPI mode is determined at the initialization of the memory card 100. Moreover, a command (SET BUS WIDTH) from the host selects between the 1-bit mode and 4-bit mode of the SD mode.

Here, as described above, the write command is serially inputted to the memory controller 12 using only the pin 2. The pin 2 allocated to the input of the command is disposed between the pin 1 and the pin 3 for a ground potential Vss as shown in FIG. 2. That is, the connector 13 is used for the host controller in the host equipment 200 and the memory card 100 to communicate with each other.

Meanwhile, communication between the memory unit 11 and the memory controller 12 is performed by a memory interface unit (which may be hereinafter simply called the "NAND bus" or "NAND interface") 21 for the NAND flash memory. Thus, although not shown here, the memory unit 11 and the memory controller 12 are connected to each other through 8-bit input/output (I/O) lines, for example.

For example, when the memory controller 12 writes data into the memory unit 11, the memory controller 12 sequentially transmits a data input command 80H, a column address, a page address, data and a program command 10H (or a cache program command 15H) to the memory unit 11 through the I/O lines. Here, "H" of the command 80H represents hexadecimal notation, and 8-bit signals "10000000" are actually given to the 8-bit I/O lines in parallel. That is, multiple bit commands are given in parallel in an external interface unit 15.

Meanwhile, in the memory interface unit 21, the commands and data to the memory unit 11 are communicated using the same common I/O line. Therefore, the interface (connector 13) through which the host controller in the host equipment 200 and the memory card 100 communicate with each other differs from the interface (NAND bus 21) through which the memory unit 11 and the memory controller 12 communicate with each other.

Figure 3:
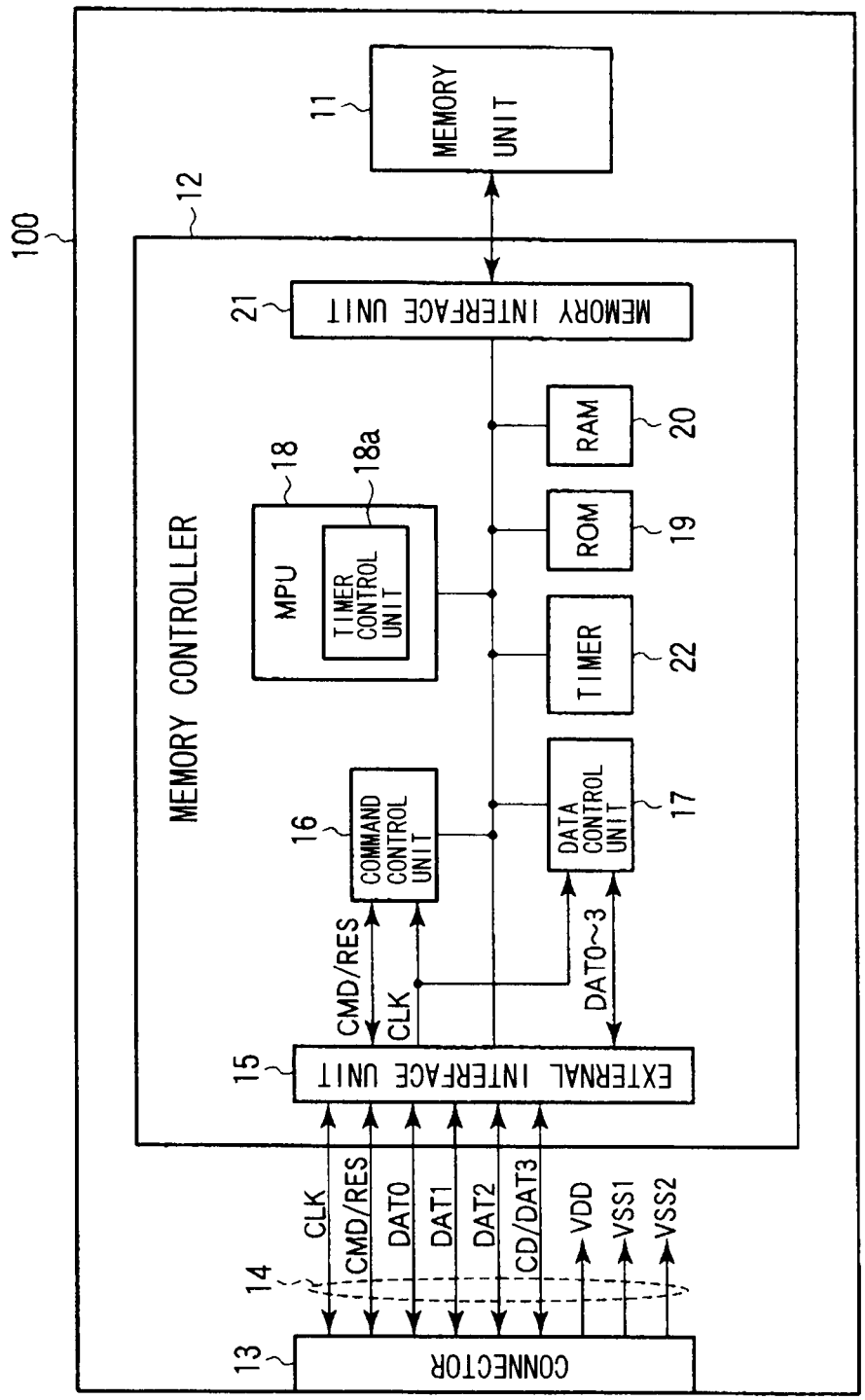
FIG. 3 is a block diagram schematically showing a configuration of a memory card according to the embodiment.

The configuration of the memory controller is described below. The internal configuration of the memory controller included in the memory card 100 shown in FIG. 1 is described with use of FIG. 3. FIG. 3 is a block diagram of the memory card 100.

The memory unit 11 is a nonvolatile semiconductor memory, and includes multiple NAND flash memories. The data and the like transmitted from the host equipment 200 are stored in the memory unit 11. Moreover, firmware (system information) that is control programs, and the like may be stored in the memory unit.

The connector 13 is connected to the memory controller 12 through a bus 14. The bus 14 includes a CLK line, a CMD/RES line, a DAT0 line, a DAT1 line, a DAT2 line, a CD/DAT3 line, a VDD line, a VSS1 line and a VSS2 line. The memory controller 12 is connected to the memory unit 11 through a bus having, for example, an 8-bit bus width.

The memory controller 12 manages the physical state in the memory unit 11 (e.g., what physical block address includes what number logical sector address data or which block is in the erased state). The memory controller 12 includes the external interface unit 15, a command control unit 16, a data control unit 17, an MPU (Micro Processing Unit) 18, a ROM (Read Only Memory) 19, a RAM (Random Access Memory) 20, the memory interface unit 21, and a timer (measurement unit) 22.

The external interface unit 15 performs an interfacing process between the memory controller 12 and the host equipment 200. To be more specific, the external interface unit 15 is a functional block connected to the host equipment 200 through the connector 13 to transmit and receive commands, various data or the like according to a predetermined protocol under the control of the MPU (control unit) 18.

The command control unit 16 receives a command CMD transmitted from the host equipment 200, and interprets the command CMD. The command control unit 16 also generates a response RES that is a response signal to the command CMD, and transmits the response RES to the host equipment 200.

The data control unit 17 transmits and receives data based on a command CMD transmitted from the host equipment 200. The data control unit 17 also generates a status data (STATUS) showing an operation state and the like of the memory card 100, and transmits the status data to the host equipment 200.

The MPU 18 controls operations of the entire memory card 100. The MPU 18 creates various tables in the RAM 20 by reading the firmware (systemm information) stored in the ROM 19 or the memory unit 11 into the RAM 20 and then executing a predetermined process when the power is supplied to the memory card 100, for example. In addition, the MPU 18 receives a write command, a read command, an erase command or the like from the host equipment 200, and then executes a predetermined process for the memory unit 11 or controls a data transfer process through a buffer. To be more specific, the MPU 18 issues a write command in writing of data, for example. The write command is, for example, "80H", "10H" or the like, which is specified by the NAND interface. The MPU 18 also has a timer control unit (measurement control unit) 18a which controls the timer 22. The timer control unit 18a can set a measurement time in the timer 22 or control the MPU 18 or the memory interface unit 21 based on a time measurement completion signal from the timer 22. Specifically, the timer control unit 18a controls the memory interface unit 21, thereby controlling (delaying) the transfer of the write command issued by the MPU 18 or the execution of data input (data in). Note that the timer control unit 18a may supply a measurement completion signal to the MPU 18. Moreover, the timer control unit 18a may be provided outside the MPU 18.

The ROM 19 is a memory to store the firmware and the like to be executed by the MPU 18. The RAM 20 is a memory used as a work area of the MPU 18 to store the firmware and various tables. The memory interface unit 21 is a functional block to perform an interfacing process between the memory controller 12 and the memory unit 11.

The memory interface unit 21 performs the transfer of the write command issued by the MPU 18 or data input (data in) to the memory unit 11 upon receipt of, for example, the time measurement completion signal or the like from the timer control unit 18a. Note that although FIG. 3 shows the MPU 18 and the memory interface unit 21 as separate circuit blocks, the function, of the MPU 18, to issue the write command, for example, may be included in the memory interface unit 21. It is possible to accomplish an adjustment of write command set timing to the memory interface unit 21 without the timer 22. It is possible to control write timing to a chip by using an internal clock of the memory controller 12 having a constant interval. Specifically, after a redundant program command (e.g. a loop process being only count up until predetermined upper limit) is executed designated numbers by firmware stored the RAM 20, a setting of the write command is executed. By an increase or a decrease of the loop numbers, although the internal clock of the MPU 18 or the controller 12 is depended, it is possible to adjust the command execution timing at a few clock units, and it becomes able to control the write timing to the chip.

The timer 22 measures (counts) time using a period from the rising edge to falling edge of 1 CLK (clock) as a minimum unit. When the time measurement is completed, the timer 22 notifies the timer control unit 18a to that effect.

In the memory controller 12, a buffer (not shown) is provided, which can temporarily store a predetermined amount of data (e.g., data for one page) when the data sent from the host equipment 200 is written to the memory unit 11 or temporarily store a predetermined amount of data when the data read from the memory unit 11 is sent to the host equipment 200.

Figure 4:
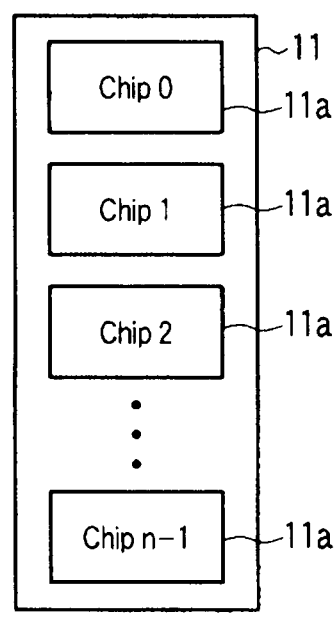
FIG. 4 is a block diagram schematically showing a configuration of a memory unit according to the embodiment.

The configuration of a memory unit 11 is schematically described. As shown in FIG. 4, the memory unit 11 has multiple chips (nonvolatile semiconductor memory chips) 11a (e.g., n chips of Chip 0 to Chip n−1). Each of the chips 11a is an NAND flash memory.

Figure 5:
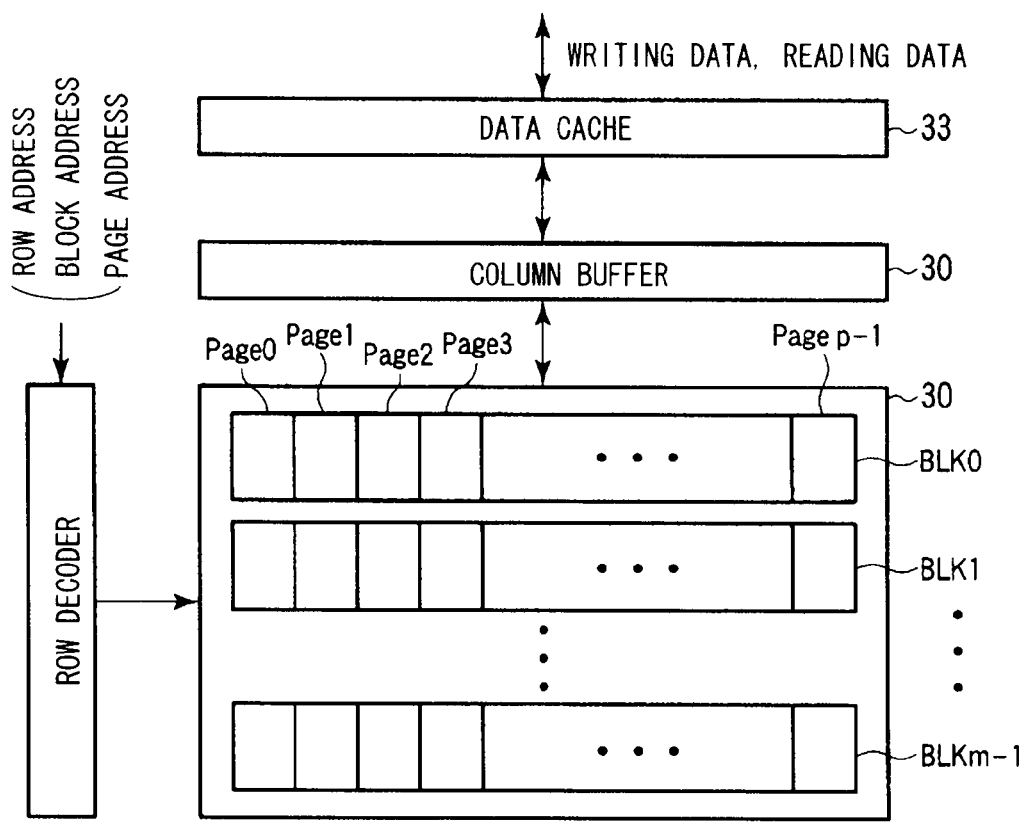
FIG. 5 is a block diagram schematically showing an internal configuration of a chip according to the embodiment.

The configuration of a NAND flash memory is described. The internal configuration of the chip 11a is schematically described with reference to FIG. 5. FIG. 5 is block diagram of the chip 11a. As a shown in FIG. 5, a memory cell array 30, a row decoder 31, a column buffer (page buffer) 32, and a data cache 33 are included in the chip 11a.

The configuration of a memory cell 30 is described. Multiple memory cell block blocks BLK (e.g., m chips of BLK 0 to BLKm−1) (m is a natural number) are included in the memory cell 30.

The memory cell block BLK includes multiple Pages 0 to p−1 (p is a natural number). The page is a unit by which data are collectively written, and is a set of multiple memory cell transistors capable of holding data. Moreover, data erasing is performed for each memory cell block BLK. That is, data in the same memory cell block BLK is erased collectively.

A row decoder 31 included in the chip 11a is described. The row decoder 31 receives a row address from the memory controller 12 and decodes the row address. The row address includes a block address specifying any of the memory cell blocks BLK and a page address specifying any of the pages. The row decoder 31 selects any of the pages in any of the memory cell blocks BLK based on the row address.

A data cache 33 is described. The data cache 33 is configured to be able to temporarily hold data of a page size.

The data cache 33 transmits and receives data to and from the memory controller 12. More specifically, the data cache 33 transfers data given from a column buffer 32 to the memory controller 12 during reading of data, receives data given from the memory controller 12 during writing, and transfers the received data page by page to the column buffer 32.

The column buffer 32 temporarily holds data read page by page from a memory cell array 30 during reading of data, and transfers the data to the data cache 33. During writing of data, the column buffer 32 transfers the data transferred from the data cache 33 to bit lines BL0 to BLn, and executes a program for each page of the data.

Figure 6:
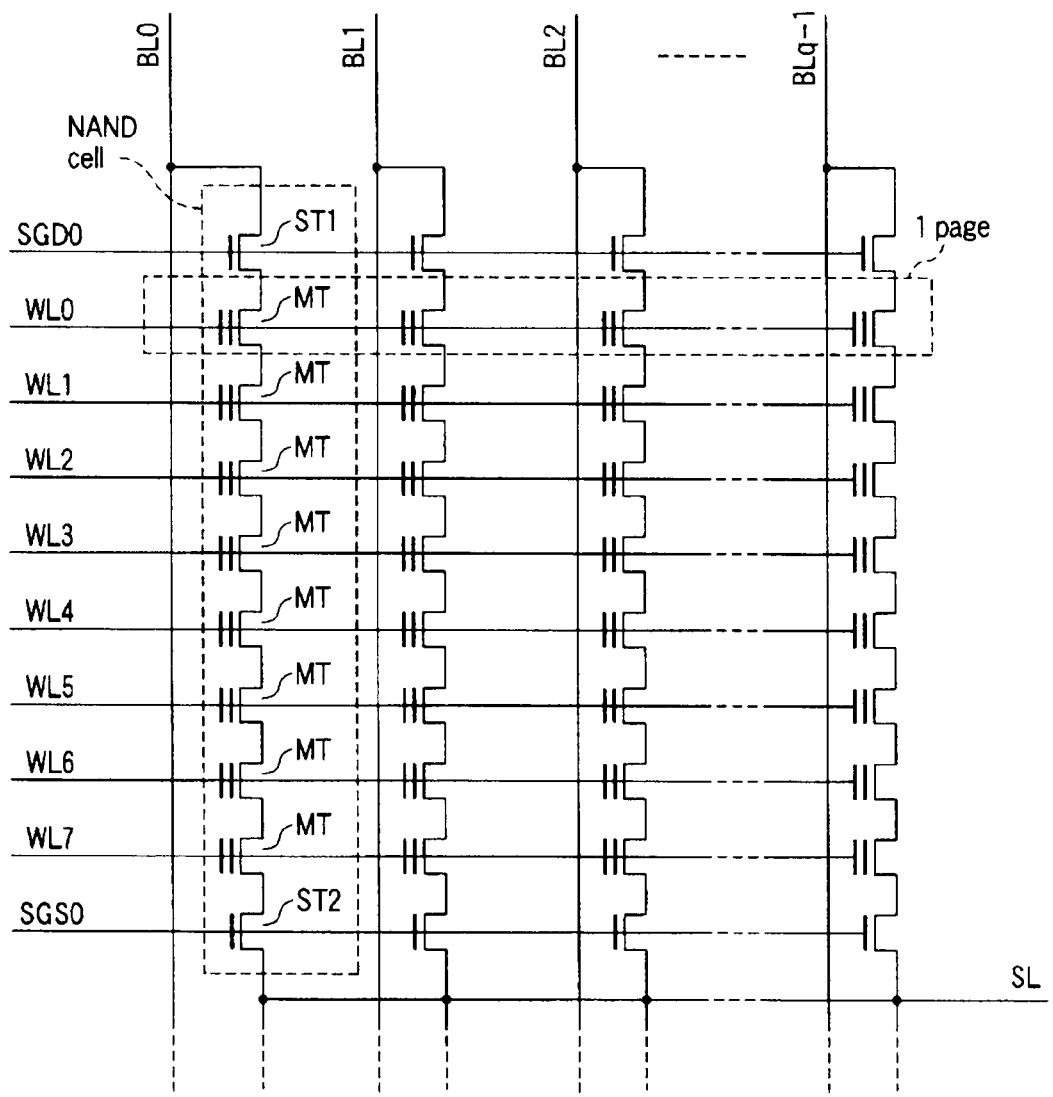
FIG. 6 is a circuit diagram of a part of a memory cell block according to the embodiment.

Next, a memory cell block is described. The configuration of a memory cell block BLK is described in detail with reference to FIG. 6. FIG. 6 is a circuit diagram of a part of a memory cell block.

As shown in FIG. 6, the memory cell block BLK has multiple NAND cells. Each of the NAND cells includes multiple (e.g., eight) memory cell transistors MT and select transistors ST1, ST2. The memory cell transistors MT each have a stacked gate structure in which a charge storage layer (e.g., a floating gate) is formed on a semiconductor substrate with a gate insulating film interposed therebetween and a control gate is formed on the charge storage layer with an inter-gate insulating film interposed therebetween. Note that the number of the memory cell transistors MT is not limited to 8 but may be 16 or 32. The memory cell transistors MT share source and drain with adjacent memory cell transistors MT, and are arranged so that current paths are connected in series between the select transistors ST1, ST2. A drain region at one end of the memory cell transistors MT connected in series is connected to a source region of the select transistor ST1, and a source region at the other end is connected to a drain region of the select transistor ST2.

The control gates of the memory cell transistors MT in the same row are connected in common to any of word lines WL0 to WL7, and gates of the select transistors ST1, ST2 of the memory cells in the same row are connected in common to select gate lines SGD and SGS, respectively. Furthermore, drains of the select transistors ST1 in the same column in the memory cell array are connected in common to any of the bit lines BL0 to BLq−1 (q is a natural number), and sources of the select transistors ST2 are connected in common to a source line SL.

In the above configuration, the data are collectively written and read for the multiple memory cell transistors MT connected to the same word line WL. The memory cell transistors MT can hold, for example, 1 bit data. In this case, one page is allocated to one word line WL. Thus, in the example shown in FIG. 6, one memory cell block BLK includes eight pages. On the other hand, the memory cell transistors MT may hold multiple bits. In this case, writing and reading of data are performed for each bit. For example, when the memory cell transistors MT hold 2 bit data, pages corresponding to a lower bit and an upper bit are allocated to one word line WL. Thus, in this case, one memory cell block BLK includes (8×2)=16 pages in the example shown in FIG. 6.

Next, description is given of control of the memory unit 11 by the memory controller 12 in the memory system thus configured. The memory controller 12 according to the embodiment can simultaneously access the multiple chips 11a in the memory unit 11. This is called parallel control.

Figure 7:
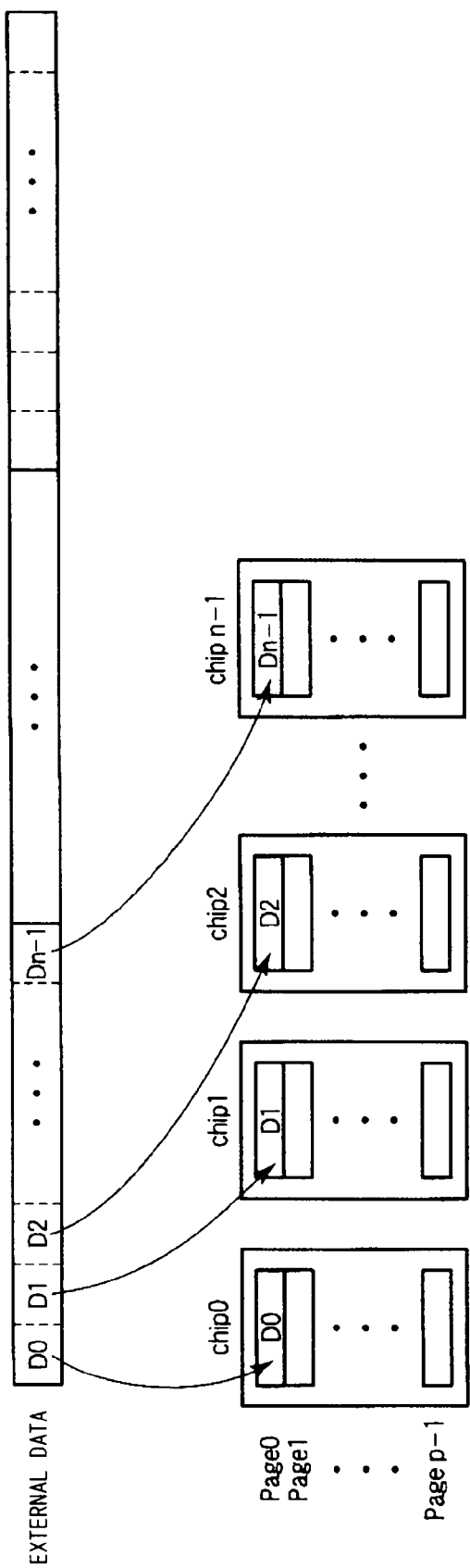
FIG. 7 is a diagram schematically showing parallel control according to a first embodiment.
Figure 8:
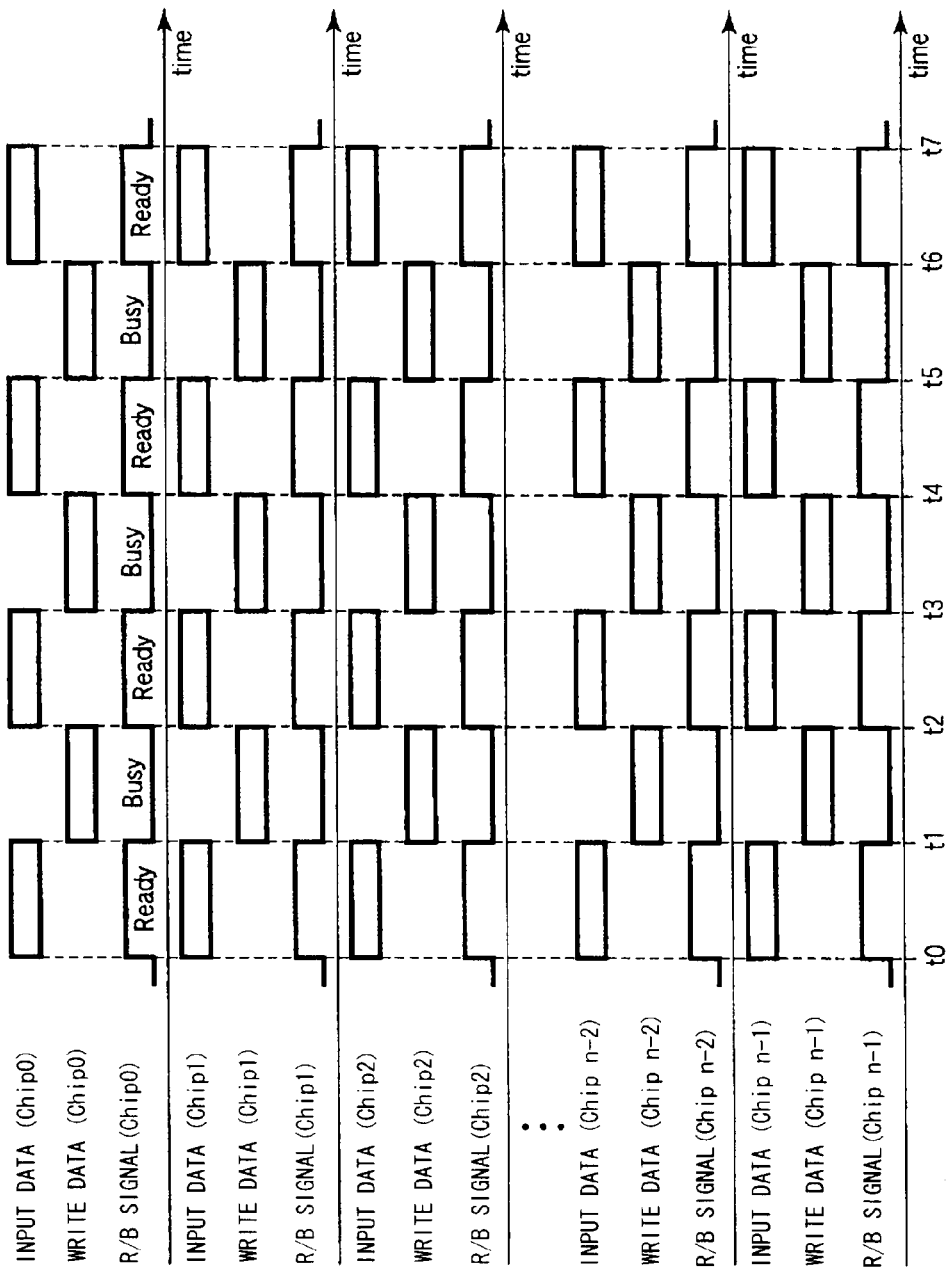
FIG. 8 is a basic timing chart of the parallel control according to the first embodiment.

Basic operations of the parallel control are described. The parallel control is described with reference to FIGS. 7 and 8. FIG. 7 is a schematic diagram of the parallel control, showing how the data (external data) transferred from the host equipment is transferred to each of the chips 11a. FIG. 8 is a basic timing chart of the parallel control, showing input data, write data and a ready/busy (R/B) signal for each of the chips 11a.

As shown in FIG. 7, in the parallel control, the data transferred from the host equipment 200 is divided into multiple pieces, which are simultaneously accessed (written) in the pages of the multiple chips 11a. To be more specific, one piece of data is divided into multiple ((n−1) in the example shown in FIG. 7) data strings D0 to Dn−1. The host equipment 200 assigns addresses to the data strings D0 to Dn−1, respectively. It is assumed, for example, that addresses corresponding to Chips 0 to n−1 are assigned to the data strings D0 to Dn−1, respectively. In this case, the data strings D0 to Dn−1 are transferred in parallel to Chips 0 to n−1.

As shown in FIG. 8, from time t0 to time t1, the memory controller 12 simultaneously transmits data strings to the chips 11a into which data are written. In this event, since each of the chips 11a is in an accessible state (data receivable state), i.e., in a ready state, a high level (also simply described as H) R/B signal is outputted.

At time t1, the memory controller 12 issues a write command (10H). In response to the command, each of the chips 11a performs writing (programming) of data strings from time t1 to time t2. Since the chip 11a is in an access prohibited state (data reception prohibited state), i.e., in a busy state during the period, a low level (also simply described as L) R/B signal is outputted. Note that the time between the start of programming and the end of programming is hereinafter referred to as busy time. In the embodiment, for convenience, the busy time is treated the same as programming time for the chip 11a.

After the programming of each of the chips 11a is completed, each chip 11a returns to the ready state. Thus, the memory controller 12 transmits data strings to the chips 11a from time t2 to time t3. Thereafter, the programming and transmission of data strings are repeated in the same manner.

Figure 9:
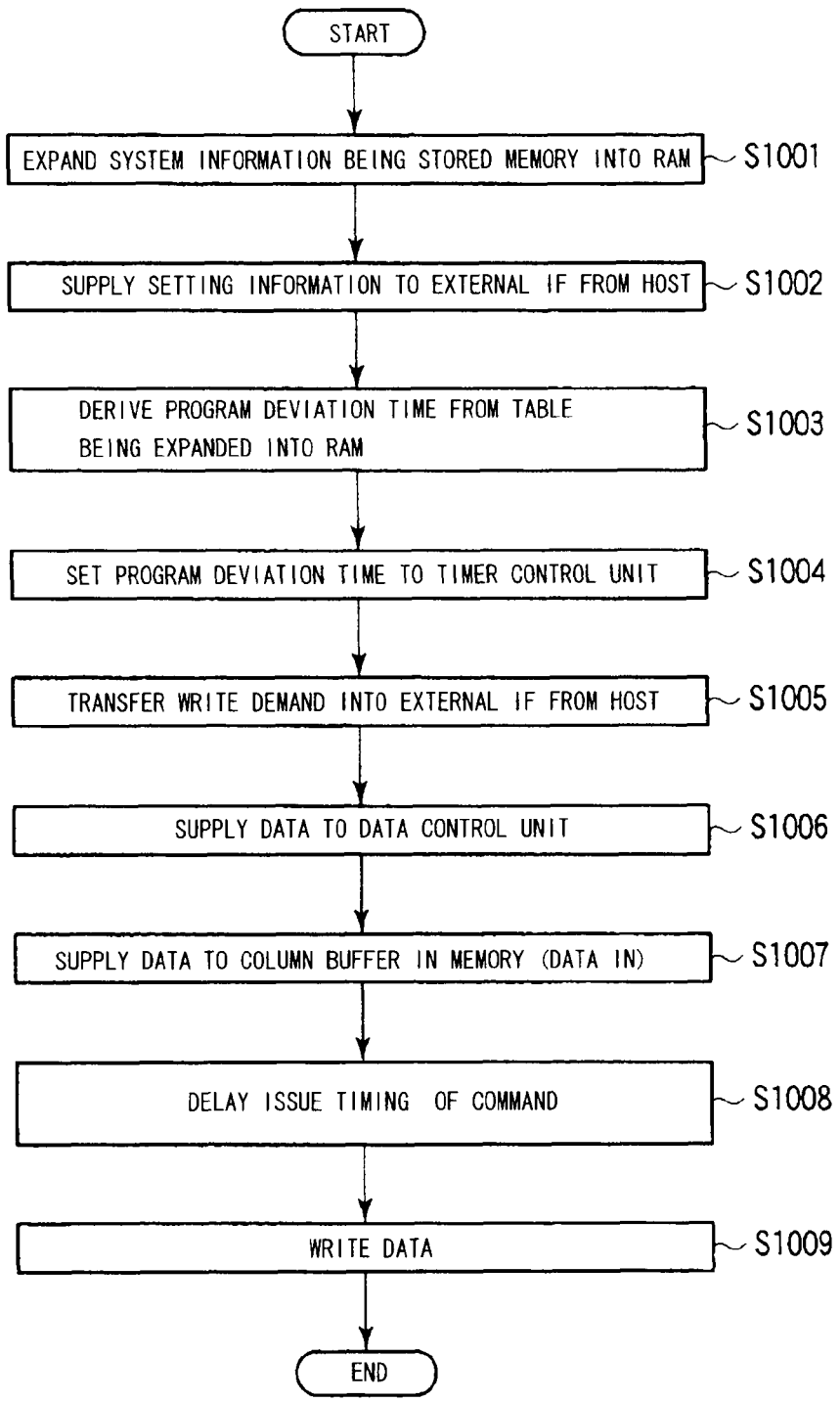
FIG. 9 is a basic flowchart of the parallel control according to the first embodiment.

Next, busy shift is described. The memory controller 12 according to the embodiment performs control to shift the program start time between the chips 11a in the parallel control described above. This is called "busy shift". The busy shift is described below with reference to FIG. 9. FIG. 9 is a basic flowchart of the parallel control according to the first embodiment, showing the flow of operations of the memory system. In the embodiment, description is given of the case where writing is performed simultaneously into n chips of Chip 0 to Chip n−1.

First, the memory controller 12 expands into the RAM 20 the firmware (system information) stored in the ROM 19 or the memory unit 11 or information on program deviation time (which may be simply called shift time or first period) stored in the memory unit 11 when the power is supplied to the memory card 100. The control is performed by the MPU 18, for example (Step S1001).

Next, setting information including current consumption limit, a transfer speed between the host equipment 200 and the memory controller 12, and the like is supplied to the external interface unit 15 from the host equipment 200 (Step S1002).

The MPU 18 derives program deviation time from the RAM 20 based on the setting information. In this event, the MPU 18 derives the program deviation time from the table expanded into the RAM 20, for example. The program deviation time is preliminarily stored in the memory unit 11, for example (Step S1003). Note that the program deviation time will be described in detail later.

Thereafter, the MPU 18 sets the program deviation time (issuance timing of a command 10H) in the timer control unit 18a. Then, the timer control unit 18a sets the program deviation time in the timer 22 (Step S1004).

Subsequently, the memory card 100 supplies a write request from the host equipment 200 to the external interface unit 15. When the memory unit 11 is in a writable state, the MPU 18 returns a response indicating that the memory unit 11 is in the writable state to the host equipment 200 (Step S1005).

Next, data divided into multiple pieces are supplied to the data control unit 17 from the host equipment 200 through the external interface unit 15. As to the divided data, the original data are not physically divided, but the address of the chip 11a into which data are written is divided into multiple addresses (Step S1006).

Thereafter, the memory controller 12 simultaneously transmits multiple divided data strings to the column buffer 32 of the multiple chips 11a in the memory unit 11 according to the address (data in). The multiple divided data strings are temporarily held in the column buffer 32. Thereafter, the MPU 18 issues a write command (10H) (Step S1007).

The timer control unit 18a controls the memory interface unit 21 to delay the transfer timing of the write command 10H to the memory unit 11 in accordance with the program deviation time set in the timer 22 (Step S1008).

The measurement by the timer 22 allows the data strings to be sequentially written into the respective chips 11a (Step S1009).

In the embodiment, the time is measured by the built-in timer 22, thereby shifting the program execution timing between the chips 11a. This is called "busy shift".

Next, the program deviation time (busy shift time) Tbd described in Step S1003 is described.

Time required to store the data strings in the memory unit 11 is defined as data-in time Tdi, and time required between the storage of the data strings in the memory unit 11 and actual recording of the data strings in the memory unit 11 is defined as program time Tpg. Assuming that the quantity of electricity in this event is Q, average current consumption Im in the case where there is no busy shift is calculated as shown in the following equation (1).

$$Im=Q/(Tdi+Tpg) \quad (1)$$

When the busy shift is performed, the time required for the storage in all the chips 11a and for the programs becomes longer by Tbd×(Nc−1) than that required when no busy shift is performed. Here, Nc is the total number of chips. In this case, average current consumption Im in the case where there is no busy shift is calculated as shown in the following equation (2).

$$Im=Q/(Tdi+Tpg+Tbd(Nc-1)) \quad (2)$$

Figure 10:
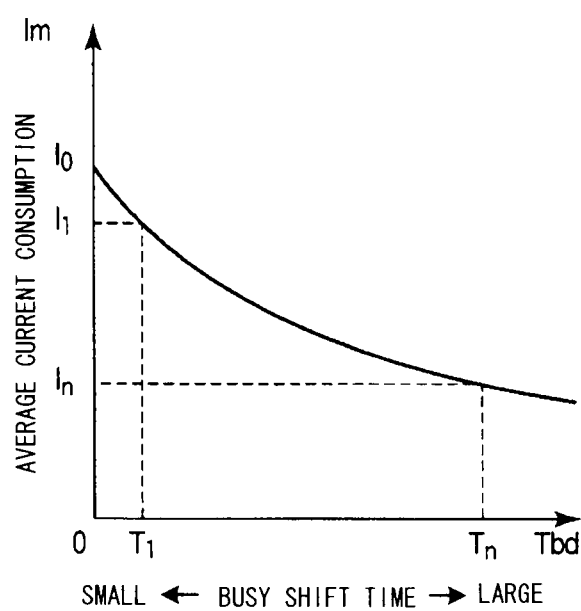
FIG. 10 is a graph showing a relationship between average current consumption and Busy shift time according to the first embodiment.

Accordingly, a relationship shown in FIG. 10 is obtained. FIG. 10 is a graph showing the average current consumption Im to the Busy shift time Tbd. FIG. 10 shows that the longer the busy shift time Tbd, the lower the average current consumption Im. Note that the average current consumption Im described here means an average of currents consumed between the start and end of writing the data strings into the memory unit 11.

FIG. 11 is a table showing a relationship between the average current consumption limit and the busy shift time. When there is no limitation on the average current consumption from the outside, i.e., when the average current consumption is $I_0$ or more in FIG. 10, the busy shift time is $T_0=0$ with the maximum writing speed performance into the memory unit 11. In other words, when there is no particular limitation on the average current consumption, no busy shift needs to be performed. On the other hand, when there is a limitation, the busy shift time is set in accordance with the limitation. For example, the memory controller 12 performs control so that the busy shift time is $T_1$ ($T_1>0$) when the average current consumption limit from the outside is $I_1$, the busy shift time is $T_2$ ($T_2>T_1$) when the average current consumption limit is $I_2$ ($I_2<I_1$), and the busy shift time is $T_{n-1}$ when the average current consumption limit is $I_{n-1}$. FIG. 11 shows that $I_0>I_1>I_2>I_3>\ldots>I_n$ and $T_n>T_{n-1}>T_{n-2}>\ldots>T_0=0$. This leads to the conclusion that the busy shift time Tbd need only be increased as the allowable maximum average current consumption is reduced.

Next, a method for setting the Busy shift time is described. As the method for setting the busy shift time (program deviation time), conceivable are a method for setting the busy shift time based on a threshold of average current consumption, a method for setting the busy shift time based on the table expanded into the RAM 20, a method for setting the busy shift time corresponding to the average current consumption by calculation, and the like.

First, description is given of the method for setting the busy shift time based on the threshold of average current consumption. In the method, the MPU 18 previously prepares in the RAM 20 the threshold of average current consumption and busy shift time corresponding to the magnitude of the threshold. These pieces of information may be read, for example, from the ROM 19 or the memory unit 11 into the RAM 20. Then, when the current consumption (required current consumption) Is set in the setting information transferred from the host equipment 200 is equal to or larger than the threshold, busy shift time $Tbd_1$ ($Tbd_1 \geq 0$) is selected. On the other hand, when the current consumption Is is smaller than the threshold, busy shift time $Tbd_2$ ($Tbd_2>Tbd_1$) is selected. In this event, an upper limit is set for $Tbd_2$ in view of the writing speed performance. In this way, the busy shift time can be set based on whether the required current consumption Is is larger or smaller than a certain threshold using the threshold as a reference.

Next, description is given of the method for setting the busy shift time based on the table expanded into the RAM 20. In the method, the MPU 18 previously prepares in the RAM 20 multiple (e.g., about ten to twenty) thresholds of average current consumption and busy shift times corresponding to the multiple thresholds. These pieces of information may be read, for example, from the ROM 19 or the memory unit 11 into the RAM 20. Then, the busy shift time is selected in accordance with the current consumption (required current consumption) set in the setting information transferred from the host equipment 200. In this way, the busy shift time can be set using the multiple thresholds as a reference. This method enables more detailed setting of the busy shift time.

Figure 12:
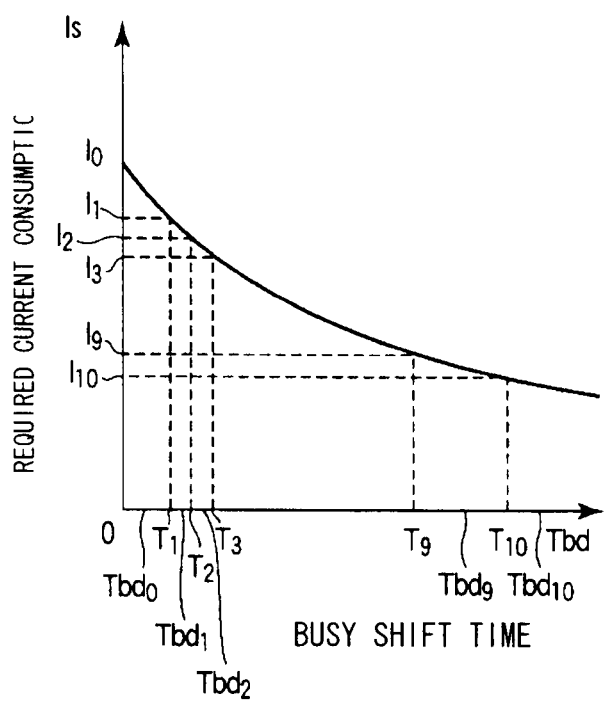
FIG. 12 is a graph showing an example of a relationship between a threshold of the average current consumption and the busy shift time according to the first embodiment.

An example of the relationship between the threshold of average current consumption and the busy shift time corresponds to the equation (2) derived above, for example, as shown in FIG. 12. FIG. 12 is a graph showing a relationship between the required current consumption Is and the busy shift time. As shown in FIG. 12, when the required current consumption Is satisfies Threshold $I_0 \geq Is >$ Threshold $I_1$, the busy shift time $Tbd_0$ ($0 \leq Tbd_0 < T_1$) between 0 and $T_1$ corresponding to between the thresholds $I_0$ and $I_1$ is selected. Meanwhile, when the required current consumption Is satisfies Threshold $I_1 \geq Is >$ Threshold $I_2$, the busy shift time $Tbd_1$ ($T_1 \leq Tbd_1 < T_2$) between $T_1$ and $T_2$ corresponding to between the thresholds $I_0$ and $I_1$ is selected based on the relationship described above. Furthermore, when the required current consumption Is is equal to or smaller than the threshold $I_{10}$ ($Is \leq I_{10}$), the busy shift time $Tbd_{10}$ equal to or larger than $T_{10}$ ($T_{10} \leq Tbd_{10}$) corresponding to the threshold $I_{10}$ based on the relationship described above. Note, however, that an upper limit is set for $Tbd_{10}$, e.g., $Tbd_{10}=T_{10}$, in view of the writing speed performance.

Next, description is given of the method for setting the busy shift time corresponding to the average current consumption by calculation. In the method, an analog circuit for calculation (not shown) is provided in the memory controller 12 to calculate the equation (2) described above based on the setting information transferred from the host equipment 200, thereby deriving the busy shift time.

As described above, the busy shift time is variable, and may be 0 depending on the request from the host equipment 200.

Figure 13:
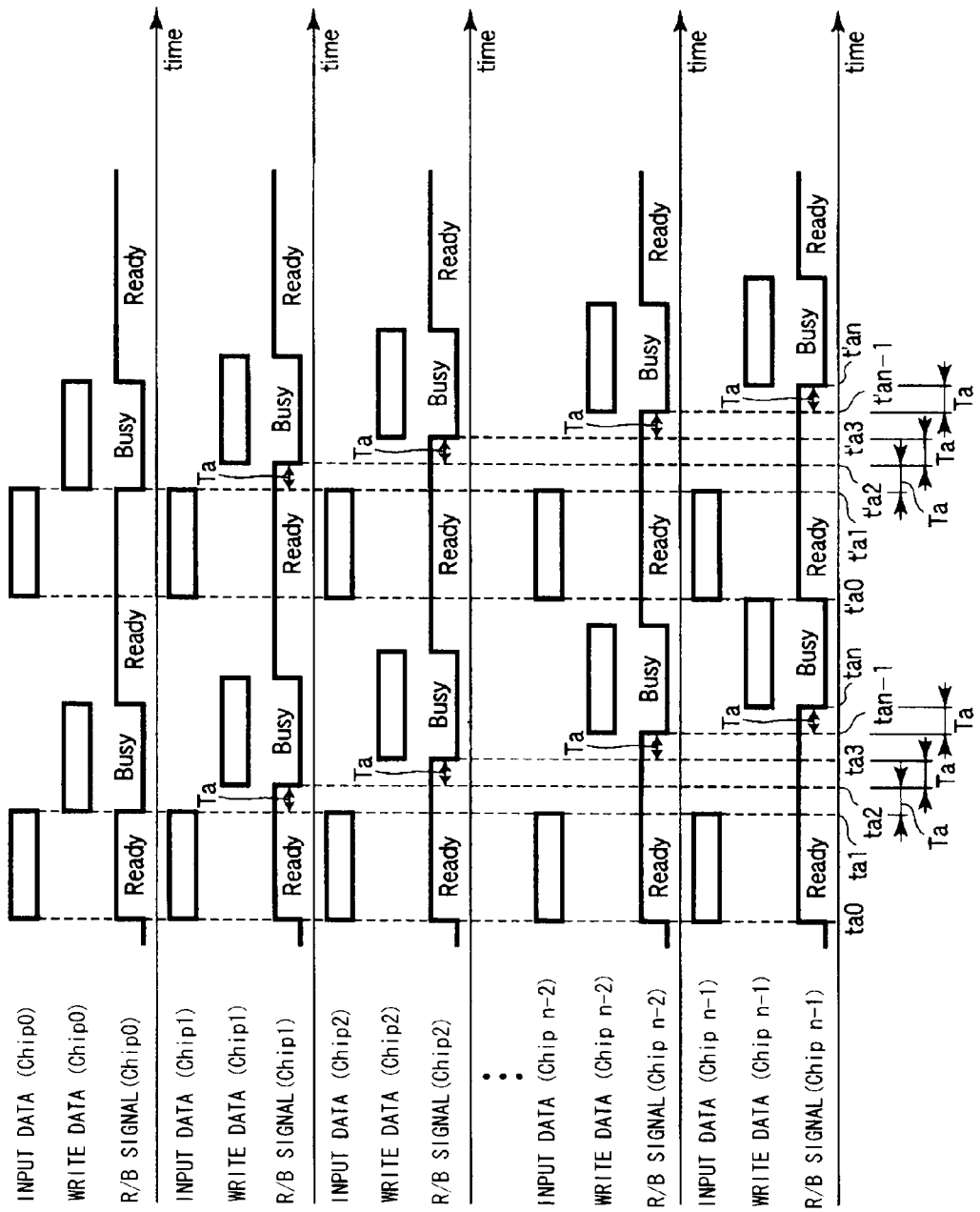
FIG. 13 is an example of a timing chart of the parallel control according to the first embodiment.

Next, concrete examples of the busy shift are described. With reference to FIG. 13, description is given of specific parallel control when the busy shift time is the time Ta. FIG. 13 is an example of a timing chart of the parallel control according to the first embodiment, showing how the data (external data) transferred from the host equipment is transferred to each of the chips 11a.

As shown in FIG. 13, all Chips 0 to n−1 are in the ready state at time point ta0. Thus, the memory controller 12 simultaneously transmits data strings to Chips 0 to n−1. In the example shown in FIG. 7, for example, the memory controller 12 transfers in parallel the data strings D0 to Dn−1 to Chips 0 to n−1. The data string transfer is performed during the period between the times ta0 and ta1.

After storage of all the data strings is completed, the memory controller 12 executes writing of the data strings at time point ta1. That is, the MPU 18 issues a write command (10H) and supplies the write command to the memory interface unit 21. In this event, the timer control unit 18a controls the memory interface unit 21 to delay the issuance of the write command to write the data strings into Chips 1 to n−1.

To be more specific, the memory interface unit 21 first issues a write command to Chip 0. Accordingly, Chip 0 is set in the busy state since data strings are written into Chip 0. As a result, an R/B signal of Chip 0 is set to be L. Then, the timer 22 recognizes that the R/B signal from Chip 0 is L, and starts counting (measuring) the busy shift time Ta set by the timer control unit 18a. The memory interface unit 21 can issue a write command to Chips 1 to n−1 when notified by the timer control unit 18a.

Thereafter, the timer 22 measures a lapse of the set busy shift time Ta from the time ta1, and then notifies the timer control unit 18a to that effect at time point ta2. Then, the timer control unit 18a, upon receipt of the notification, notifies the memory interface unit 21 to that effect. Upon receipt of the notification, the memory interface unit 21 issues a write command to Chip 1. Alternatively, the timer control unit 18a may command or request the memory interface unit 21 to issue a data string write command to Chip 1, next. Thus, Chip 1 starts writing of data strings. As a result, Chip 1 becomes the Busy state, and the R/B signal of Chip 1 is set to be L. Then, the timer 22 recognizes that the R/B signal from Chip 1 is L, resets the count (measurement), for example, and starts counting (measuring) from 0 to the busy shift time Ta set by the timer control unit 18a.

Thereafter, the timer 22 measures an elapse of the set busy shift time Ta from the time ta2, and then notifies the timer control unit 18a to that effect at time point ta3. The timer control unit 18a, upon receipt of the notification, notifies the memory interface unit 21 to that effect. Upon receipt of the notification, the memory interface unit 21 issues a write command to Chip 2. Alternatively, the timer control unit 18a may command or request the memory interface unit 21 to issue a data string write command to Chip 2, next. Thus, Chip 2 starts writing of data strings. As a result, Chip 2 becomes the busy state, and the R/B signal of Chip 2 is set to be L. Then, the timer 22 recognizes that the R/B signal from Chip 2 is L, resets the measurement, for example, and starts measuring from 0 to the busy shift time Ta set by the timer control unit 18a.

The timer control unit 18a similarly controls the memory interface unit 21, and measures from the time 0 to the time Ta every time an R/B signal from Chip x (x is a natural number) is recognized as being L. Then, when the timer 22 finishes measuring the time Ta, the memory interface unit 21 issues a data string write command to Chip x+1. In this way, the memory interface unit 21 issues a write command every time the timer 22 measures the time Ta up to the chip n−1. As a result, the data strings are written in a sequentially shifted manner into Chips 0 to n−1.

At time t'a0 when writing of data strings into all the chips 11a is completed, all Chips 0 to n−1 are in the ready state. Thus, the memory controller 12 simultaneously transmits the data strings to Chips 0 to n−1. Thereafter, the writing and transmission of data strings are repeated in the same manner.

Figure 14:
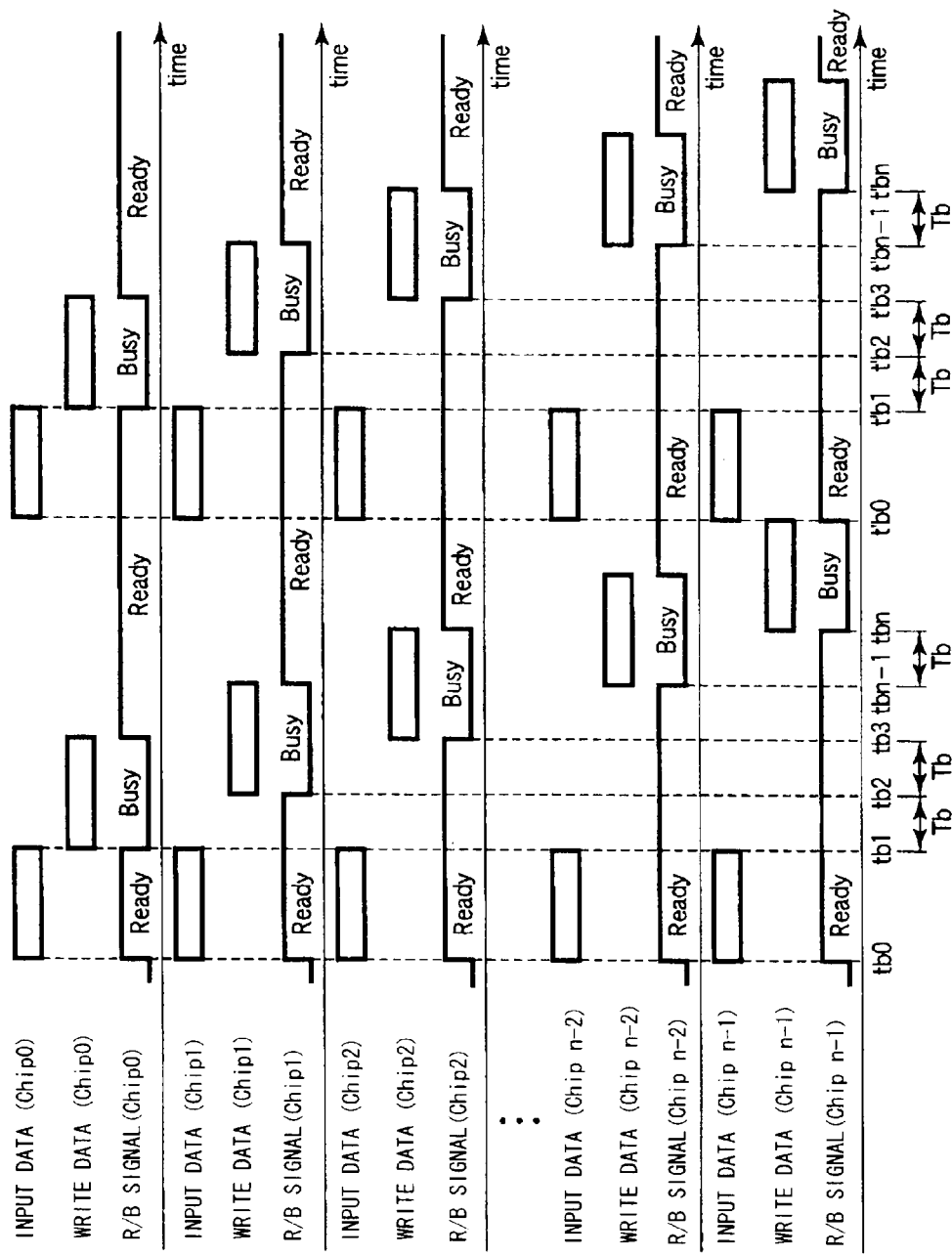
FIG. 14 is another example of a timing chart of the parallel control according to the first embodiment.

Next, with reference to FIG. 14, description is given of specific parallel control when the busy shift time is the time Tb (Tb>Ta). FIG. 14 is another example of a timing chart of the parallel control according to the first embodiment.

As shown in FIG. 14, all Chips 0 to n−1 are in the ready state at time point tb0. Thus, the memory controller 12 simultaneously transmits data strings to Chips 0 to n−1.

After storage of all the data strings is completed, the memory controller 12 executes writing of the data strings at time point tb1. That is, the MPU 18 issues a write command and supplies the write command to the memory interface unit 21. In this event, the timer control unit 18a controls the memory interface unit 21 to delay the issuance of the write command to write the data strings into Chips 1 to n−1.

Thereafter, the timer 22 measures an elapse of the set Busy shift time Tb from the time tb1, and then notifies the timer control unit 18a to that effect at time point tb2. Then, the timer control unit 18a, upon receipt of the notification, notifies the memory interface unit 21 to that effect. Upon receipt of the notification, the memory interface unit 21 issues a write command to Chip 1. Thus, Chip 1 starts writing of data strings. As a result, the R/B signal of Chip 1 is set to be L. Then, the timer 22 recognizes that the R/B signal from Chip 1 is L, resets the measurement, for example, and starts measuring from 0 to the Busy shift time Tb set by the timer control unit 18a.

Thereafter, the timer 22 measures a lapse of the set busy shift time Tb from the time point tb2, and then notifies the timer control unit 18a to that effect at time point tb3. The timer control unit 18a, upon receipt of the notification, notifies the memory interface unit 21 to that effect. Upon receipt of the notification, the memory interface unit 21 issues a write command to Chip 2. Thus, Chip 2 starts writing of data strings. As a result, the R/B signal of Chip 2 is set to be L. Then, the timer 22 recognizes that the R/B signal from Chip 2 is L, resets the measurement, and starts measuring from 0 to the busy shift time Tb.

In the same way, the memory interface unit 21 issues a write command every time the timer 22 measures the time Tb up to the chip n−1. As a result, the data strings are written in a sequentially shifted manner into Chips 0 to n−1.

At time t'b0 when writing of data strings into all the chips 11a is completed, all Chips 0 to n−1 are in the ready state. Thus, the memory controller 12 simultaneously transmits data strings to Chips 0 to n−1. Thereafter, the writing and transmission of data strings are repeated in the same manner.

FIGS. 13 and 14 show that the longer the busy shift time Tbd, the smaller the number of the chips 11a into which data strings are simultaneously written.

According to the embodiment described above, the memory system includes the memory unit 11 having nonvolatile first and second Chips 0 and 1 capable of holding data, the memory controller 12 transferring data received from the host equipment 200 simultaneously to first and second Chips 0 and 1, the timer 22 measuring a lapse of preset busy shift time, and the timer control unit 18a starting writing of data into second Chip 1 immediately after the lapse of the busy shift time. The memory system further includes the RAM 20 capable of holding multiple different busy shift times, and the timer control unit 18a selects any one of the multiple busy shift times in the RAM 20.

In the parallel control, current consumption is increased since writing of data into the multiple chips 11a is performed all at once. However, shifting the timings of writing data strings into the respective chips 11a based on the setting information from the host equipment 200 makes it possible to reduce the number of the chips 11a into which the data strings are simultaneously written, and to suppress the average or instantaneous current consumption. Accordingly, the current consumption can be suppressed to be equal to or smaller than the value of average current consumption required by the host equipment 200. As a result, the memory system capable of suppressing the average or instantaneous current consumption can be obtained.

Next, with reference to FIGS. 15 to 21, description is given of control of a memory unit 11 by a memory controller 12 in a memory system according to a second embodiment. The memory controller 12 according to the second embodiment can start, during writing of data strings into chips 11a in the memory unit 11, accessing the other chips 11a. This is called interleave control. Note that, in the description of the interleave control, description of portions overlapping with those in the first embodiment is omitted.

Figure 15:
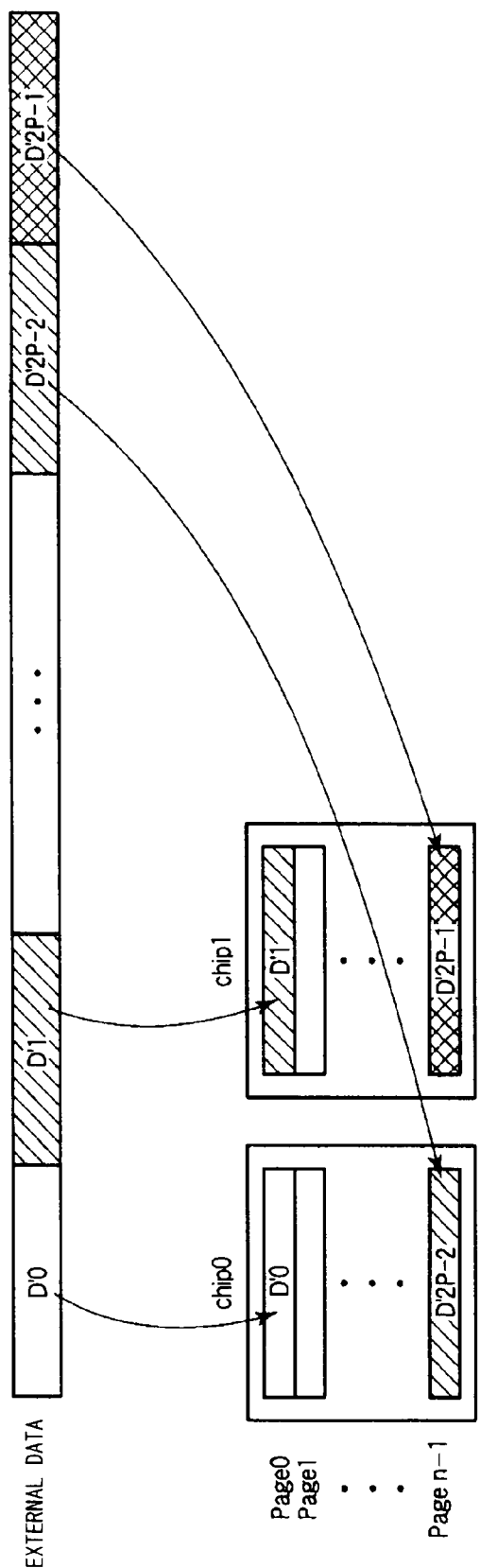
FIG. 15 is a diagram schematically showing interleave control according to a second embodiment.
Figure 16:
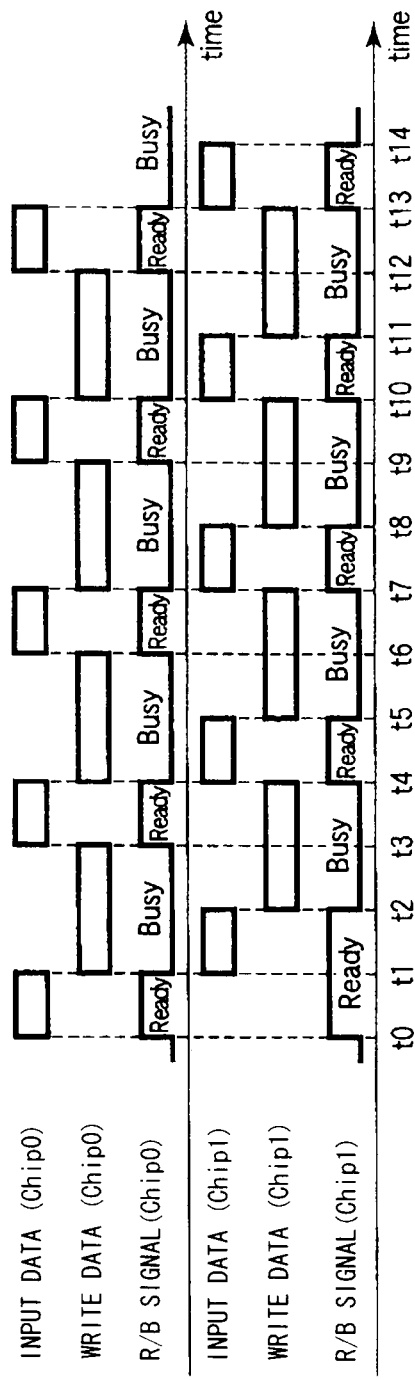
FIG. 16 is a basic timing chart of the interleave control according to the second embodiment.

Basic operations of the interleave control are described. The interleave control is described with reference to FIGS. 15 and 16. FIG. 15 is a schematic diagram of the interleave control, showing how the data (external data) transferred from the host equipment 200 is transferred to each of the chips 11a. FIG. 16 is a basic timing chart of the interleave control, showing input data, write data and a ready/busy (R/B) signal for each of the chips 11a. In the embodiment, as an example, the interleave control is performed for the two chips 11a, i.e., the Chips 0 and 1.

As shown in FIG. 15, in the interleave control, data D'0 transferred from the host equipment 200 is transferred to Chip 0, and new data D'1 transferred from the host equipment 200 is transferred to and written into Chip 1 different from Chip 0 while the data D'0 is being written into Chip 0. Note that the data D'0 to D'$2p-1$ are different from each other. Moreover, an address corresponding to Chip 0 or 1 is assigned to each of the data D'0 to D'$2p-1$ by the host equipment 200.

As shown in FIG. 16, the memory controller 12 transmits data to Chip 0 into which data are written from time t0 to time t1. In this event, since the two Chips 0 and 1 are in a Ready state, a high-level R/B signal is outputted.

At time t1, the memory controller 12 issues a write command (10H). In response to the command, Chip 0 performs writing of data from time t1 to time t3. Since Chip 0 is in an access prohibited state (data reception prohibited state), i.e., in a busy state during the period, a low-level R/B signal is outputted. Moreover, the memory controller 12 starts transmitting data to Chip 1 when the memory controller 12 recognizes the low-level R/B signal from Chip 0. During this period, Chip 1 outputs the high-level R/B signal.

At time t2, the memory controller 12 issues a write command (10H). In response to the command, Chip 1 performs writing of data from time t2 to time t4. Since Chip 1 is in an access prohibited state (data reception prohibited state), i.e., in a busy state during the period, a low-level R/B signal is outputted.

At time t3, after the writing of data into Chip 0 is completed, Chip 0 returns to the Ready state. Thus, the memory controller 12 transmits data strings to Chip 0 from time t3 to time t4. Thereafter, the programming and transmission of data strings are repeated in the same manner.

Figure 17:
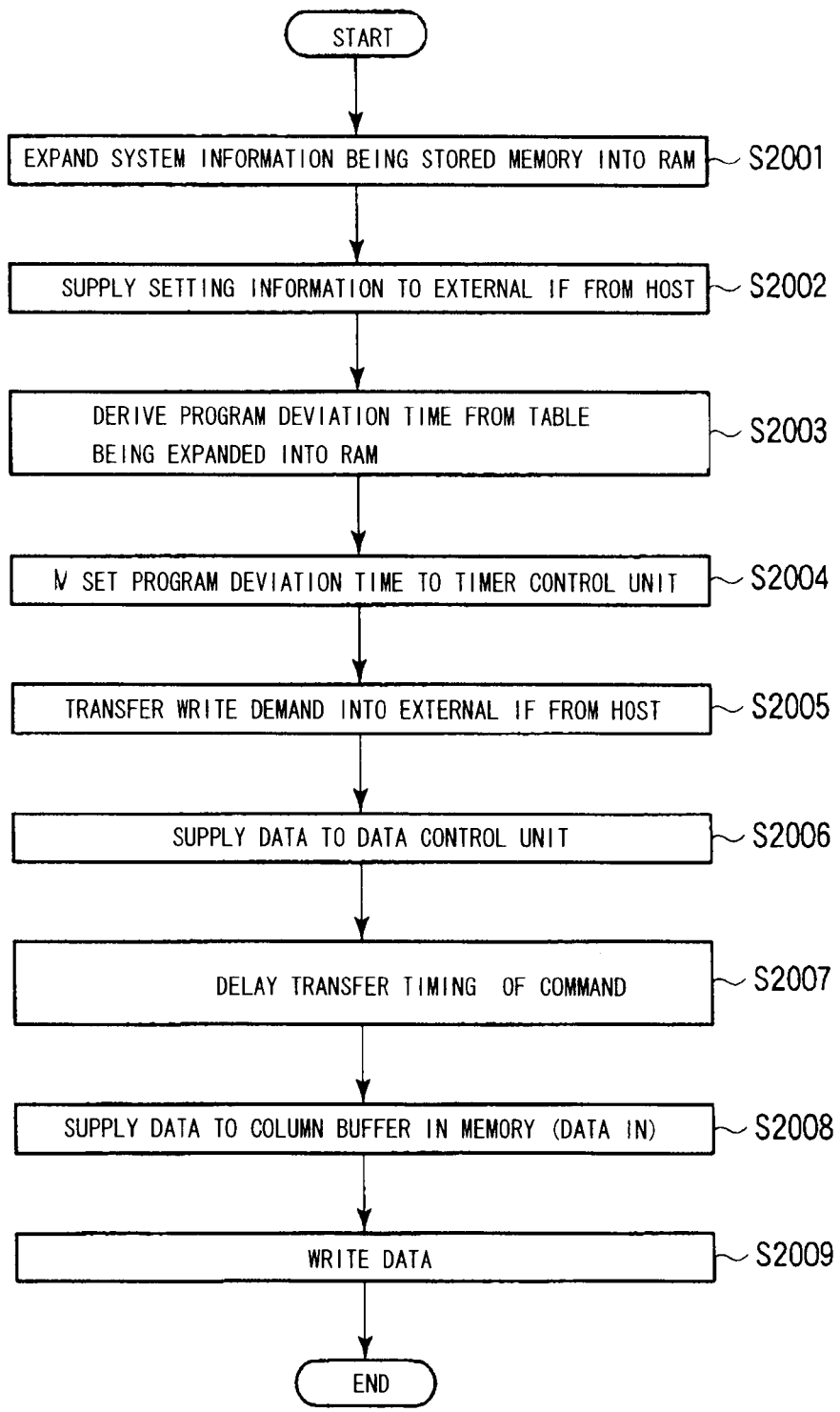
FIG. 17 is a basic flowchart of the interleave control according to the second embodiment.

Next, data-in shift is described. The memory controller 12 according to the embodiment performs control to shift data input time between the chips 11a in the parallel control described above. This is called "data-in shift". The data-in shift is described below with reference to FIG. 17. FIG. 17 is a basic flowchart of the interleave control according to the second embodiment, showing the flow of operations of the memory system. In the embodiment, description is given of the case where writing is performed simultaneously into 2 chips of Chip 0 and Chip 1.

First, the memory controller 12 expands the firmware (system information) stored in the ROM 19 or the memory unit 11 or information on data-in shift time (which may be simply called deviation time or first period) stored in the memory unit 11 into the RAM 20 when the power is supplied to the memory card 100. This control is performed by the MPU 18, for example (Step S2001).

Next, setting information including current consumption limit, a transfer speed between the host equipment 200 and the memory controller 12, and the like is supplied to the external interface unit 15 from the host equipment 200 (Step S2002).

The MPU 18 derives data-in shift time from the RAM 20 based on the setting information. In this event, the MPU 18 derives the data-in shift time from the table expanded into the RAM 20, for example. The data-in shift time is preliminarily stored in the memory unit 11, for example (Step S2003). Note that the data-in shift time will be described in detail later.

Thereafter, the MPU 18 sets the data-in shift time (data input timing) in the timer control unit 18a. Then, the timer control unit 18a sets the data-in shift time in the timer 22 (Step S2004).

Subsequently, the memory card 100 supplies a write request from the host equipment 200 to the external interface unit 15. When the memory unit 11 is in a writable state, the MPU 18 returns to the host equipment 200 a response indicating that the memory unit 11 is in the writable state (Step S2005).

Next, data are supplied to the data control unit 17 from the host equipment 200 through the external interface unit 15. The data are temporarily held in a buffer in the memory controller 12 (Step S2006).

Next, the timer control unit 18a controls the memory interface unit 21 based on the data-in shift time to delay the transfer timing of transferring data to the memory unit 11 (Step S2007).

The memory controller 12 supplies data to a column buffer 32 in the memory unit 11 (data in), and then the MPU 18 issues a write command (10H) (Step S2008).

The measurement by the timer 22 allows the data strings to be sequentially written into the respective chips 11a (Step S2009).

In the embodiment, the time is measured by the built-in timer 22, thereby shifting the data input timing.

Next, the data-in shift time Tdd described in Step S2003 is described.

Time required to store the data in the memory unit 11 is defined as data-in time Tdi, and time required between the storage of the data in the memory unit 11 and actual recording of the data strings in the memory unit 11 is defined as program time Tpg. As to the average current consumption Im, if the writing size is sufficiently large, the first Tdi of Chip 0 is reduced to a negligible level. Assuming that the quantity of electricity in this event is Q, average current consumption Im in the case where there is no data-in shift is calculated as shown in the following equation (3).

$$Im \approx Q/(Tdi+Tpg) \qquad (3)$$

When the data-in shift is performed, the time required for the storage in Chips 0 and 1 and for the programming becomes longer by Tdd×2 (twice as long as Tdd) than that required when no data-in shift is performed. In this case, average current consumption Im in the case where there is data-in shift is calculated as shown in the following equation (4).

$$Im \approx Q/(Tdi+Tpg+2Tdd) \qquad (4)$$

Figure 18:
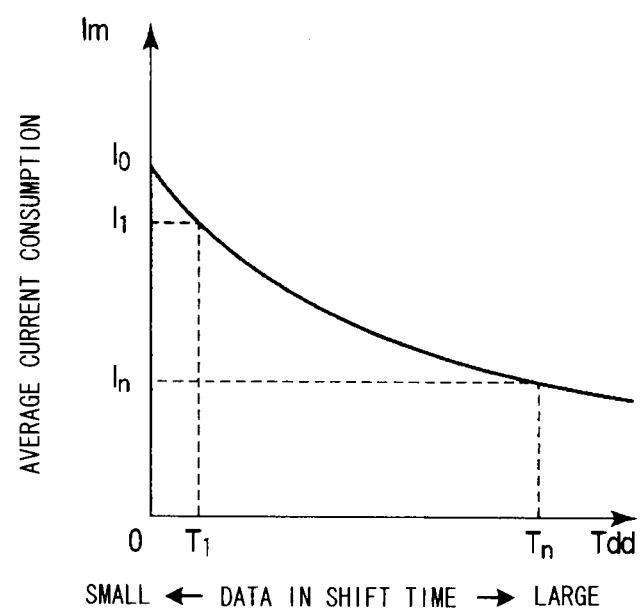
FIG. 18 is a table showing a relationship between average current consumption and data-in shift time according to the second embodiment.

Accordingly, a relationship shown in FIG. 18 is obtained. FIG. 18 is a graph showing the average current consumption Im to the data-in shift time Tdd. FIG. 18 shows that the longer the data-in shift time Tdd, the lower the average current consumption Im.

FIG. 11 is a table showing a relationship between the average current consumption limit and the data-in shift time. When limitation on the average current consumption from the outside is $I_0$ or more, i.e., when there is no limitation on the average current consumption and writing speed performance into the memory unit 11 is the maximum, the data-in shift time is $T_0=0$. In other words, when there is no particular limitation on the average current consumption, no data-in shift needs to be performed. On the other hand, when there is a limitation, the data-in shift time is set in accordance with to the limitation. For example, the memory controller 12 performs control so that the data-in shift time is $T_1$ ($T_1>0$) when the average current consumption limit from the outside is $I_1$, the data-in shift time is $T_2$ ($T_2>T_1$) when the average current consumption limit is $I_2$ ($I_2<I_1$), and the busy shift time is $T_{n-1}$ when the average current consumption limit is $I_{n-1}$. FIG. 11 shows that $I_0>I_1>I_2>I_3>\ldots>I_n$ and $T_n>T_{n-1}>T_{n-2}>\ldots>T_0=0$. This leads to the conclusion that the data-in shift time Tdd need only be increased as the allowable maximum average current consumption is reduced.

Next, a method for setting the data-in shift time is described. As the method for setting the data-in shift time (program deviation time), are conceivable a method for setting the data-in shift time based on a threshold of average current consumption, a method for setting the data-in shift time based on the table expanded into the RAM 20, a method for setting the data-in shift time corresponding to the average current consumption by calculation, and the like, as in the first embodiment described above. Note that a basic method for deriving the data-in shift time is the same as that for the busy shift time described above.

First, description is given of the method for setting the data-in shift time based on the threshold of average current consumption. In the method, the MPU 18 previously prepares in the RAM 20 the threshold of average current consumption and data-in shift time corresponding to the magnitude of the threshold. These pieces of information may be read, for example, from the ROM 19 or the memory unit 11 into the RAM 20. Then, when the current consumption (required current consumption) Is set in the setting information transferred from the host equipment 200 is equal to or larger than the threshold, data-in shift time $Tdd_1$ ($Tdd_1>0$) is selected. On the other hand, when the current consumption Is is smaller than the threshold, data-in shift time $Tdd_2$ ($Tdd_2>Tdd_1$) is selected. In this event, an upper limit is set for $Tdd_2$ in view of the writing speed performance. In this way, the data-in shift time can be set based on whether the required current consumption Is is larger or smaller than a certain threshold using the threshold as a reference.

Next, description is given of the method for setting the data-in shift time based on the table expanded into the RAM 20. In the method, the MPU 18 previously prepares in the RAM 20 multiple (e.g., about ten to twenty) thresholds of average current consumption and data-in shift times corresponding to the multiple thresholds. These pieces of information may be read, for example, from the ROM 19 or the memory unit 11 into the RAM 20. Then, the data-in shift time is selected in accordance with the current consumption (required current consumption) set in the setting information transferred from the host equipment 200. In this way, the data-in shift time can be set using the multiple thresholds as a reference. This method enables more detailed setting of the data-in shift time.

Figure 19:
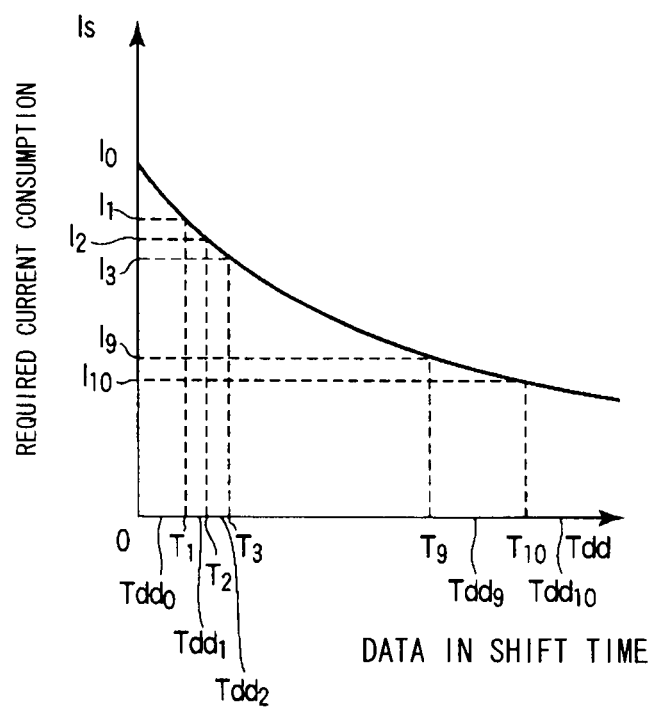
FIG. 19 is a graph showing an example of a relationship between a threshold of the average current consumption and the data-in shift time according to the second embodiment.

An example of the relationship between the threshold of average current consumption and the data-in shift time corresponds to the equation (2) derived above, for example, as shown in FIG. 19. FIG. 19 is a graph showing a relationship between the required current consumption Is and the data-in shift time. As shown in FIG. 12, when the required current consumption Is satisfies Threshold $I_0 \geq Is >$ Threshold $I_1$, the data-in shift time $Tdd_0$ ($0 \leq Tdd_0 < T_1$) between 0 and $T_1$ corresponding to between the thresholds $I_0$ and $I_1$ is selected. Meanwhile, when the required current consumption Is satisfies Threshold $I_1 \geq Is >$ Threshold $I_2$, the data-in shift time $Tdd_1$ ($T_1 \leq Tdd_1 < T_2$) between $T_1$ and $T_2$ corresponding to between the thresholds $I_0$ and $I_1$ is selected based on the relationship described above. Furthermore, when the required current consumption Is is the threshold $I_{10} \geq Is$, the data-in shift time $Tdd_{10}$ equal to or larger than $T_{10}$ ($T_{10} \leq Tdd_{10}$) corresponding to the threshold $I_{10}$ is selected based on the relationship described above. Note, however, that an upper limit is set for $Tdd_{10}$, e.g., $Tdd_{10}=T_{10}$, in view of the writing speed performance.

Next, description is given of the method for setting the data-in shift time corresponding to the average current consumption by calculation. In the method, an analog circuit for calculation (not shown) is provided in the memory controller 12 to calculate the equation (4) described above based on the setting information transferred from the host equipment 200, thereby deriving the data-in shift time.

As described above, the data-in shift time is variable, and may be 0 depending on the request from the host equipment 200.

Figure 20:
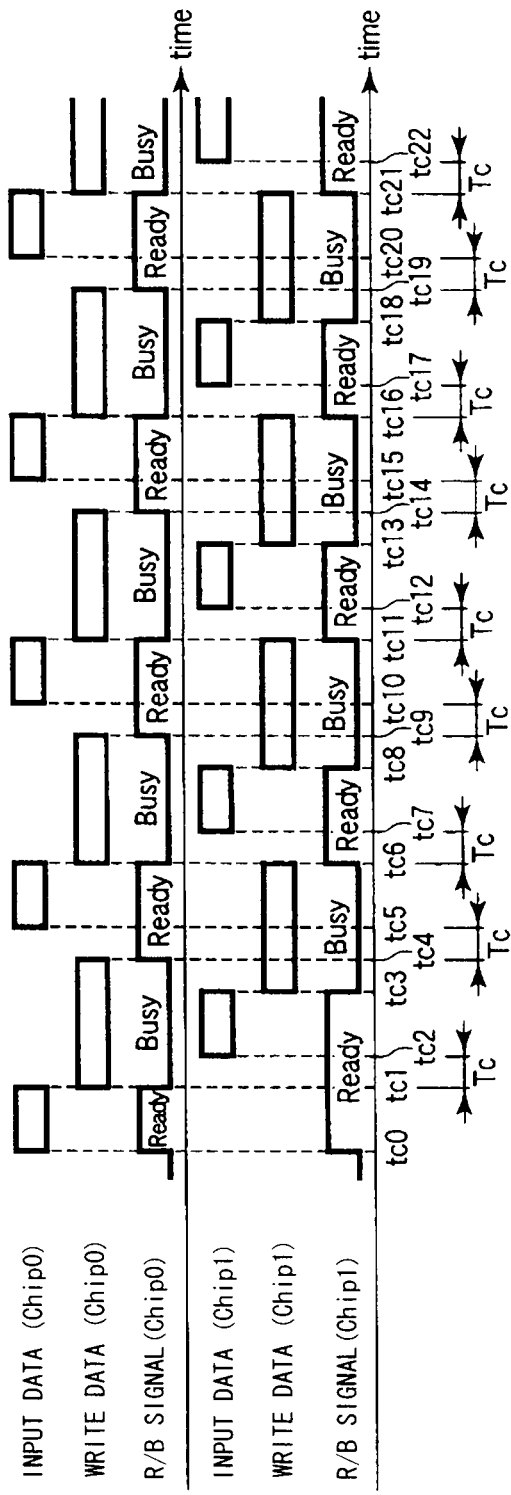
FIG. 20 is an example of a timing chart of the interleave control according to the second embodiment.

Next, concrete examples of the data-in shift are described. With reference to FIG. 20, description is given of specific interleave control when the data-in shift time is the time Tc. FIG. 20 is an example of a timing chart of the interleave control according to the second embodiment, showing how the data (external data) transferred from the host equipment 200 is transferred to each of the chips 11a.

As shown in FIG. 20, Chip 0 and Chip 1 are in the ready state at time point tc0. Thus, the memory controller 12 performs data transmits to Chip 0.

After storage of the data in Chip 0 is completed, the memory controller 12 executes writing of the data strings at time point tc1. That is, the MPU 18 issues a write command and supplies the write command to the memory interface unit 21. Then, the data are written into Chip 0. In this event, the timer control unit 18a controls the memory interface unit 21 to delay the data input to Chip 1.

To be more specific, the memory interface unit 21 first issues a write command to Chip 0. Accordingly, Chip 0 is set in the busy state since data strings are written into Chip 0. As a result, an R/B signal of Chip 0 is set to be L. Then, the timer 22 recognizes that the R/B signal from Chip 0 is L, and starts measuring the data-in shift time Tc set by the timer control unit 18a. The memory interface unit 21 can transmit data to Chip 0 or Chip 1 when notified by the timer control unit 18a.

Thereafter, the timer 22 measures a lapse of the set data-in shift time Tc from the time tc1, and then notifies the timer control unit 18a to that effect at time point tc2. Then, the timer control unit 18a, upon receipt of the notification, notifies the memory interface unit 21 to that effect. Upon receipt of the notification, the memory interface unit 21 performs data input to Chip 1. Alternatively, the timer control unit 18a may command or request the memory interface unit 21 to transmit data to Chip 1, next. Thus, the data are transmitted to Chip 1.

At time tc3, data are written into Chip 1. Accordingly, the R/B signal of Chip 1 becomes L.

Next, at time point tc4, writing of data into Chip 0 is completed. Thus, Chip 0 becomes the ready state, and the R/B signal of Chip 0 becomes H. Then, the timer 22 recognizes that the R/B signal from Chip 0 is H, resets the measurement, and starts measuring from 0 to the data-in shift time Tc set by the timer control unit 18a.

Thereafter, the timer 22 measures a lapse of the set data-in shift time Tc from the time tc4, and then notifies the timer control unit 18a to that effect at time point tc5. Then, the timer control unit 18a, upon receipt of the notification, notifies the memory interface unit 21 to that effect. Upon receipt of the notification, the memory interface unit 21 transmits data to Chip 0. Alternatively, the timer control unit 18a may command or request the memory interface unit 21 to transmit data to Chip 0, next. Thus, the data are transmitted to Chip 0.

The timer 22 similarly measures from the time 0 to the time Ta every time an R/B signal from Chip y (y is 0 or 1) is recognized as being H. Then, when the timer 22 finishes measuring the time Tc, the memory interface unit transmits data to Chip y. In this way, the memory interface unit 21 transmits data every time the timer 22 measures the time Tc. As a result, the data are written in a sequentially shifted manner into Chips 0 and 1. Thereafter, the writing and transmission of data are repeated in the same manner.

Figure 21:
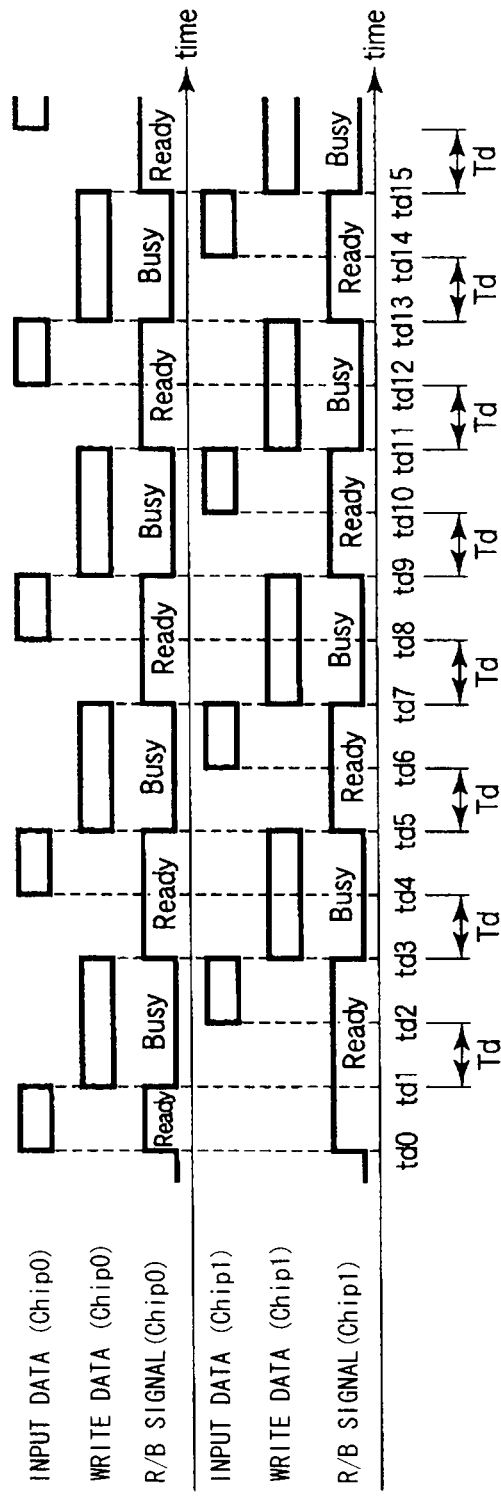
FIG. 21 is another example of a timing chart of the interleave control according to the second embodiment.

With reference to FIG. 21, description is given of specific interleave control when the program deviation time is the time Td (Td>Tc). FIG. 21 is another example of a timing chart of the interleave control according to the second embodiment.

As shown in FIG. 21, Chips 0 and 1 are in the ready state at time point td0. Thus, the memory controller 12 transmits data to Chip 0.

After storage of the data in Chip 0 is completed, the memory controller 12 executes writing of the data strings at time point td1. That is, the MPU 18 issues a write command and supplies the write command to the memory interface unit 21. The data are written into Chip 0. In this event, the timer 22 controls the memory interface unit 21 to delay the data input into Chip 1.

To be more specific, the memory interface unit 21 first issues a write command to Chip 0. Accordingly, an R/B signal of Chip 0 is set to be L. The timer 22 recognizes that the R/B signal from Chip 0 is L, and starts measuring the data-in shift time Td set by the timer control unit 18a. The memory interface unit 21 can transmit the data to Chip 0 or Chip 1 when notified by the timer 22.

Thereafter, the timer 22 measures a lapse of the set data-in shift time Td from time td1, and then provides notification to that effect at time point td2. Then, the memory interface unit 21, upon receipt of the notification, transmits the data to Chip 1. Alternatively, the timer 22 may command or request the memory interface unit 21 to transmit the data to Chip 1, next. Thus, the data are transmitted to Chip 1.

At time td3, data are written into Chip 1. Accordingly, the R/B signal of Chip 1 becomes L.

Next, at time point td3, writing of data into Chip 0 is completed. Thus, Chip 0 becomes the ready state, and the R/B signal of Chip 0 becomes H. Then, the timer 22 recognizes that the R/B signal from Chip 0 is H, resets the measurement, and starts measuring from 0 to the data-in shift time Td set by the timer control unit 18a.

Thereafter, the timer 22 measures a lapse of the set data-in shift time Td from time td3, and then provides notification to that effect at time point td4. The memory interface unit 21, upon receipt of the notification, transmits the data to Chip 0. Alternatively, the timer 22 may command or request the memory interface unit 21 to transmit the data to Chip 0, next. Thus, the data are transmitted to Chip 0.

Thereafter, the writing and input of data are repeated in the same manner.

FIGS. 20 and 21 show that the longer the data-in shift time Tdd, the shorter the time during which data are written simultaneously into two chips 11a.

According to the embodiment described above, the memory system includes the memory unit 11 having nonvolatile first and second Chips 0 and 1 capable of holding data, the memory controller 12 to transfer data received from the host equipment 200 alternately to first and second Chips 0 and 1, the timer 22 to measure a lapse of preset data-in shift time, and the timer control unit 18a to start the input of data to second Chip 1 immediately after the lapse of the data-in shift time. The memory system further includes the RAM 20 capable of holding multiple different data-in shift times, and the timer control unit 18a selects any one of the multiple data-in shift times in the RAM 20.

In the interleave control, current consumption is increased since writing of data into two chips 11a, for example, is performed all at once. However, shifting the timings of inputting data to the respective chips 11a based on the setting information from the host equipment 200 makes it possible to reduce the time during which the data are written simultaneously to the multiple chips 11a, and to suppress the average or instantaneous current consumption. Accordingly, the current consumption can be suppressed to be equal to or smaller than the value of average current consumption required by the host equipment 200. As a result, the memory system capable of suppressing the average or instantaneous current consumption can be obtained.

Figure 22:
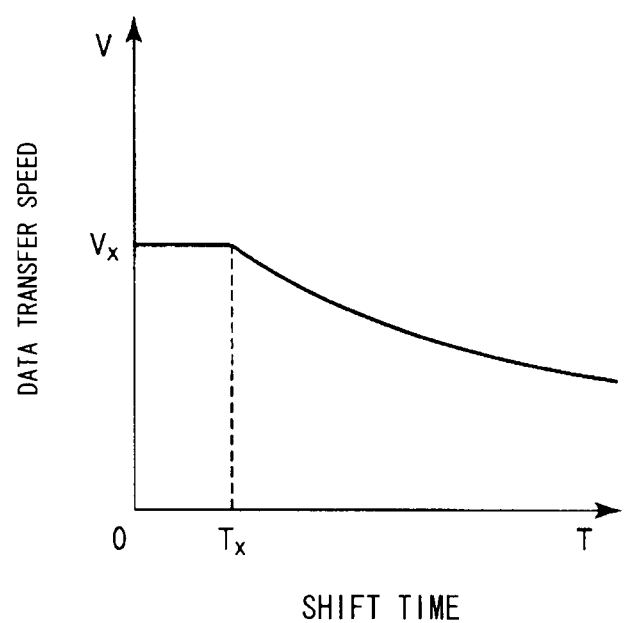
FIG. 22 is a graph showing a relationship between a data transfer speed between host equipment and an external interface unit and busy shift time or data-in shift time according to a third embodiment.

Next, with reference to FIG. 22, description is given of a memory system according to a third embodiment. In the third embodiment, busy shift time or data-in shift time is set based on data transfer speed (bus transfer speed) between host equipment 200 and an external interface unit 15. Note that, in the description herein, description of portions overlapping with those in the first and second embodiments is omitted.

FIG. 22 is a graph showing a relationship between a data transfer speed V between the host equipment 200 and the external interface unit 15 and busy shift time or data-in shift time (also simply called shift time) T.

There is a case where a maximum data transfer speed $V_x$ between the host equipment 200 and a memory controller 12 is lower than a maximum data transfer speed $V_y$ ($V_y > V_x$) between the memory controller 12 and a memory unit 11. Note that the shift time T set long reduces the speed of the memory system. However, since the maximum data transfer speed $V_x$ between the host equipment 200 and the memory controller 12 is lower than the maximum data transfer speed $V_y$ between the memory controller 12 and the memory unit 11, the maximum data transfer speed of the memory system turns out to be the speed $V_x$. For this reason, it turns out that the maximum data transfer speed of the memory system is not reduced even if the shift time T is set within the range $0 \leq T \leq T_x$ as shown in FIG. 12.

As a method for obtaining the minimum shift time $T_x$, the maximum data transfer speed $V_x$ between the host equipment 200 and the memory controller 12 is derived by, for example, the external interface unit 15, and the speed information is supplied to the MPU 18. The speed information is stored in the memory unit 11 or the like. The table showing the relationship between the data transfer speed and the shift time is expanded into the RAM 20. Then, the MPU 18 derives the minimum shift time $T_x$ corresponding to the maximum transfer speed $V_x$ from the table expanded into the RAM 20.

According to the embodiment described above, in the memory system, the busy shift time or the data-in shift time (the first period) is determined based on the data transfer speed from the host equipment 200.

When the data transfer speed between the host equipment 200 and the memory controller 12 is lower than the data transfer speed between the memory controller 12 and the memory unit 11, the speed performance of the entire memory system is dependent on the data transfer speed between the host equipment 200 and the memory controller 12.

Figure 23:
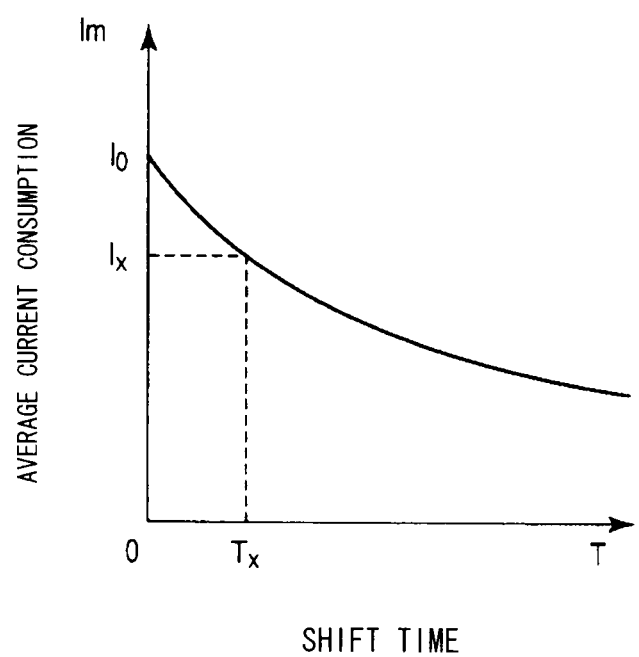
FIG. 23 is a table showing a relationship between average current consumption and Busy shift time or data-in shift time according to the third embodiment.

However, as shown in FIG. 23, when the shift time T is the time $T_x$, average current consumption Im turns out to be current $I_x$ ($I_x<I_0$). FIG. 23 shows that the longer the shift time T, the smaller the average current consumption Im. Since the shift time need only be within $0 \le T \le T_x$, the average current consumption can be reduced to be smaller than $I_0$.

Therefore, by controlling the busy shift time or the data-in shift time T based on the data transfer speed between the host equipment 200 and the memory controller 12, the average current consumption can be suppressed without degrading the speed performance of the entire memory system. As a result, the memory system capable of suppressing the average or instantaneous current consumption without degrading the speed performance can be achieved.

Note that the description has been given in the first to third embodiments by taking the SD memory card as an example. However, the invention is also applicable to other memory cards, memory devices, internal memories and the like as long as such devices are semiconductor storage devices having the same bus structure, and the same advantageous effects as those of the memory card 100 or the like can be achieved. The invention is also applicable to, for example, a semiconductor device having multiple memory chips mounted in host equipment. Furthermore, the memory chip is not limited to the NAND flash memory, but may be other semiconductor memories.

Moreover, in the embodiments described above, the timer 22 controls the issuance of the write command (10H) by the MPU 18 or the execution of data input (data in) by controlling the memory interface unit 21. However, the timer 22 may notify the MPU 18 of the completion of the measurement of the first period, thereby allowing the MPU 18 to control (delay) the issuance of the write command (10H) or the execution of data input (data in).

Furthermore, although the parallel control and the interleave control are separately performed in the first and second embodiments described above, the parallel control and the interleave control may be combined. Thus, the busy shift and data-in shift in the first and second embodiments can be simultaneously performed.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a semiconductor storage unit having nonvolatile first and second semiconductor memory chips capable of holding data;
   a memory controller configured to transfer data received from host equipment simultaneously to the first and second semiconductor memory chips;
   a measurement unit configured to measure a lapse of a preset first period; and
   a control unit configured to start writing of the data into the second semiconductor memory chip immediately after the lapse of the first period; and
   a storage region capable of holding a plurality of the first periods different from one another, wherein
   the control unit selects any one of the plurality of first periods in the storage region.

2. The memory system according to claim 1, wherein the control unit starts writing the data into the first semiconductor memory chip immediately after a completion of a write ready condition in the first and second semiconductor memory chips, the control unit starts writing the data into the second semiconductor memory chip immediately after the lapse of the first period.

3. The memory system according to claim 1, wherein an upper limit is set for the first period.

4. The memory system according to claim 1, wherein the first period is determined based on a speed of data transfer from the host equipment.

5. The memory system according to claim 1, wherein the memory system is a memory card.

6. The memory system according to claim 1, wherein the measurement unit and the control unit are provided in the memory controller.

7. A memory system, comprising:
   a semiconductor storage unit having nonvolatile first and second semiconductor memory chips capable of holding data;
   a memory controller configured to transfer data received from host equipment alternately to the first and second semiconductor memory chips;
   a measurement unit configured to measure a lapse of a preset first period;
   a control unit configured to start input of the data into the second semiconductor memory chip immediately after the lapse of the first period; and
   a storage region capable of holding a plurality of the first periods different from one another, wherein
   the control unit selects any one of the plurality of first periods in the storage region.

8. The memory system according to claim 7, wherein the control unit starts writing the data into the first semiconductor memory chip immediately after a completion of a write ready condition in the first semiconductor memory chip, a write ready condition in the second semiconductor memory chip is started immediately after the lapse of the first period when a write ready condition in the first semiconductor memory chip is started, the control unit starts writing the data into the second semiconductor memory chip.

9. The memory system according to claim 7, wherein an upper limit is set for the first period.

10. The memory system according to claim 7, wherein the first period is determined based on a speed of data transfer from the host equipment.

11. The memory system according to claim 7, wherein the memory system is a memory card.

12. The memory system according to claim 7, wherein the measurement unit and the control unit are provided in the memory controller.

13. A memory system, comprising:
- a semiconductor storage unit having nonvolatile first and second semiconductor memory chips capable of holding data;
- an external interface unit configured to transfer data outputted from host equipment;
- a memory controller unit configured to transfer data received through the external interface unit from the host equipment simultaneously or alternately to the first and second semiconductor memory chips based on a data transfer speed between the host equipment and the external interface unit;
- a measurement unit configured to measure a lapse of a preset first period; and
- a control unit configured to start writing of the data into the second semiconductor memory chip immediately after the lapse of the first period when the memory controller unit transfers the data simultaneously to the first and second semiconductor memory chips, and to start inputting the data to the second semiconductor memory chip immediately after the elapsed time of the first period when the memory controller unit transfers the data alternately to the first and second semiconductor memory chips.

14. The memory system according to claim 13, wherein an upper limit is set for the first period.

15. The memory system according to claim 13, further comprising:
- a storage region capable of holding a plurality of the first periods different from one another, wherein
- the control unit selects any one of the plurality of first periods in the storage region.

* * * * *